US012765181B2

(12) United States Patent
Hong et al.

(10) Patent No.: US 12,765,181 B2
(45) Date of Patent: Oct. 13, 2026

(54) DISPLAY PANEL AND DISPLAY DEVICE

(71) Applicant: Samsung Display Co., Ltd., Yongin-si (KR)

(72) Inventors: Sungjin Hong, Yongin-si (KR); Yoomin Ko, Yongin-si (KR); Sunho Kim, Yongin-si (KR); Hyewon Kim, Yongin-si (KR); Juchan Park, Yongin-si (KR); Pilsuk Lee, Yongin-si (KR); Chung Sock Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 278 days.

(21) Appl. No.: 18/489,979

(22) Filed: Oct. 19, 2023

(65) Prior Publication Data

US 2024/0138200 A1 Apr. 25, 2024
US 2024/0237419 A9 Jul. 11, 2024

(30) Foreign Application Priority Data

Oct. 21, 2022 (KR) ........................ 10-2022-0136376

(51) Int. Cl.
*H10K 59/122* (2023.01)
*H10K 50/822* (2023.01)
(Continued)

(52) U.S. Cl.
CPC ......... *H10K 59/122* (2023.02); *H10K 50/822* (2023.02); *H10K 50/844* (2023.02); *H10K 59/131* (2023.02)

(58) Field of Classification Search
CPC .. H10K 59/122; H10K 50/822; H10K 50/844; H10K 59/12; H10K 59/123;
(Continued)

(56) References Cited

U.S. PATENT DOCUMENTS 8,415,872 B2 4/2013 Choi et al.
8,648,337 B2 2/2014 Hsieh
(Continued)

FOREIGN PATENT DOCUMENTS

CN 103280539 9/2013
CN 113871430 A 12/2021
(Continued)

*Primary Examiner* — Shahed Ahmed
(74) *Attorney, Agent, or Firm* — F. CHAU & ASSOCIATES, LLC

(57) ABSTRACT

A display device includes a display panel including a first region, a second region, and a third region. The display panel includes a plurality of light emitting devices disposed in the first electrode, and each including a first electrode, an intermediate layer disposed on the first electrode, and a second electrode disposed on the intermediate layer, a separator including a pixel boundary portion disposed in the first region, a peripheral partition portion disposed in the second region, and a peripheral boundary portion disposed in the first region and the third region, and a plurality conductive pattern layers disposed in the second region. A plurality of second electrodes of the plurality of light emitting devices are electrically separated by the pixel boundary portion, and the plurality of conductive pattern layers are electrically separated by the peripheral partition portion.

28 Claims, 21 Drawing Sheets

(51) Int. Cl.
*H10K 50/844* (2023.01)
*H10K 59/131* (2023.01)

(58) Field of Classification Search
CPC ............... H10K 59/35; H10K 59/8051; H10K 59/80521; H10K 59/8723; H10K 59/10–221; H10K 59/131–1315; H10D 30/6755; H10D 86/60; G02F 1/1339–13398
See application file for complete search history.

(56) References Cited

U.S. PATENT DOCUMENTS

| | | | |
|---|---|---|---|
| 12,284,864 B2 | 4/2025 | Jang et al. | |
| 12,289,977 B2 | 4/2025 | Tang | |
| 2006/0113896 A1* | 6/2006 | Cho | H10K 59/173 313/506 |
| 2010/0231490 A1 | 9/2010 | Okano | |
| 2017/0338293 A1 | 11/2017 | Guo | |
| 2021/0098737 A1* | 4/2021 | Pang | H10K 59/8722 |
| 2021/0149524 A1* | 5/2021 | Bang | G06F 3/0446 |

FOREIGN PATENT DOCUMENTS

| | | |
|---|---|---|
| KR | 10-1699911 | 1/2017 |
| KR | 10-2018-0002436 A | 1/2018 |
| KR | 10-2021-0037352 | 4/2021 |
| KR | 10-2022-0086917 A | 6/2022 |

* cited by examiner

DISPLAY PANEL AND DISPLAY DEVICE

CROSS-REFERENCE TO RELATED APPLICATION(S)

This application claims priority to and benefits of Korean Patent Application No. 10-2022-0136376 under 35 U.S.C. § 119, filed on Oct. 21, 2022, the entire contents of which are incorporated herein by reference.

BACKGROUND

1. Technical Field

Embodiments relate to a display panel and a display device with minimized afterimage defects.

2. Description of the Related Art

Multimedia electronic devices such as televisions, mobile phones, tablet computers, computers, navigation system units, and game consoles are equipped with a display panel for displaying images.

The display panel includes a light emitting device and a circuit for driving the light emitting device. Light emitting devices included in the display panel emit light and generate images according to a voltage applied in the circuit. In order to improve the reliability of the display panel, research has been conducted on the connection of the light emitting device and the circuit.

SUMMARY

Embodiments provide a display panel and a display device capable of preventing or minimizing afterimage defects.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include a display panel including a display region and a peripheral region surrounding the display region, the display panel including: a first region overlapping the display region, a second region overlapping a portion of the peripheral region, and a third region overlapping another portion of the peripheral region and disposed between the first region and the second region. In an embodiment, the display panel may include a plurality of light emitting devices disposed in the first region, each of the plurality of light emitting devices including a first electrode, an intermediate layer disposed on the first electrode, and a second electrode disposed on the intermediate layer, a separator including a pixel boundary portion disposed in the first region, a peripheral partition portion disposed in the second region, and a peripheral boundary portion disposed in the first region and the third region, and a plurality conductive pattern layers disposed in the second region, wherein a plurality of second electrodes of the plurality of light emitting devices may be electrically separated by the pixel boundary portion, and the plurality of conductive pattern layers may be electrically separated by the peripheral partition portion.

In an embodiment, the display panel may further include a pixel definition film defining a light emitting opening which exposes at least a portion of the first electrode, wherein the pixel boundary portion, the peripheral boundary portion, and the peripheral partition portion may be disposed on the pixel definition film.

In an embodiment, the plurality of second electrodes and the plurality of conductive pattern layers may include a same material, and the plurality of second electrodes and the plurality of conductive pattern layers may be disposed on the pixel definition film.

In an embodiment, the display panel may further include a base layer, and a plurality of insulation layers disposed on the base layer, wherein a plurality of voltage lines for transmitting different voltages may be disposed on at least one of the base layer and the plurality of insulation layers in the second region.

In an embodiment, each of the plurality of conductive pattern layers may be electrically connected to at least one of the plurality of voltage lines.

In an embodiment, the peripheral partition portion may include a plurality of peripheral partition portions protruding and extending from the peripheral boundary portion.

In an embodiment, the peripheral boundary portion may include a first side extending in a first direction and a second side intersecting the first direction, and each of the plurality of peripheral partition portions may extend from at least one of the first side and the second side of the peripheral boundary portion.

In an embodiment, each of the plurality of peripheral partition portions may extend from the first side of the peripheral boundary portion in a direction parallel to the first direction.

In an embodiment, some of the plurality of peripheral partition portions may protrude and extend from the first side of the peripheral boundary portion in a direction parallel to a second direction intersecting the first direction, and others of the plurality of peripheral partition portions may protrude and extend from the second side of the peripheral boundary portion in a direction parallel to the first direction.

In an embodiment, the peripheral partition portion may include a plurality of first sub-peripheral partition portions extending in a first direction, and disposed spaced apart in a second direction intersecting the first direction, and a plurality of second sub-peripheral partition portions extending in the second direction, and disposed spaced apart in the first direction.

In an embodiment, the plurality of first sub-peripheral partition portions may intersect the plurality of second sub-peripheral partition portions.

In an embodiment, the peripheral partition portion may include a first sub-peripheral partition portion surrounding the peripheral boundary portion.

In an embodiment, the peripheral partition portion may further include a second sub-peripheral partition portion surrounding the first sub-peripheral partition portion.

In an embodiment, the separator may include a multi-layered member including at least one of an organic material, a metal, or a transparent electrode.

In an embodiment, the display panel may further include a plurality of transistors, and a plurality of connection wirings that connect the plurality of light emitting devices and the plurality of transistors, respectively. In an embodiment, each of the plurality of connection wirings may include a first connection part connected to a corresponding light emitting device among the plurality of light emitting devices, and spaced apart from a light emitting opening in which the corresponding light emitting device is defined in a plan view, and a second connection part connected to a corresponding transistor among the plurality of transistors.

In an embodiment, each of the plurality of connection wirings may include a first layer, a second layer, and a third layer, wherein a side surface of the third layer may form a tip part protruding from a side surface of the second layer, wherein the second electrode may be disconnected by the tip part.

In an embodiment, each of the plurality of transistors may be an N-type oxide semiconductor.

In an embodiment, a display panel may include a base layer including a display region and a peripheral region surrounding the display region, the base layer including: a first region overlapping the display region, a second region overlapping a portion of the peripheral region, and a third region overlapping another portion of the peripheral region and disposed between the first region and the second region, a first light emitting device disposed on the first region of the base layer, and including a first anode electrode, a first intermediate layer disposed on the first anode electrode, and a first cathode electrode disposed on the first intermediate layer, a second light emitting device disposed on the first region of the base layer, and including a second anode electrode, a second intermediate layer disposed on the second anode electrode, and a second cathode electrode disposed on the second intermediate layer, a plurality conductive pattern layers disposed in the second region, a pixel boundary portion disposed in the first region, and separating the first cathode electrode and the second cathode electrode, a peripheral partition portion disposed in the second region, and separating the plurality of conductive pattern layers, and a peripheral boundary portion disposed in the first region and in the third region.

In an embodiment, the first cathode electrode, the second cathode electrode, and the plurality of conductive pattern layers may include a same material.

In an embodiment, the display panel may further include a base layer, and a plurality of insulation layers disposed on the base layer, wherein a plurality of voltage lines for transmitting different voltages may be disposed on at least one of the base layer and the plurality of insulation layers in the second region.

In an embodiment, each of the plurality of conductive pattern layers may be electrically connected to at least one of the plurality of voltage lines.

In an embodiment, the peripheral partition portion may include a plurality of peripheral partition portions protruding and extending from the peripheral boundary portion.

In an embodiment, the peripheral boundary portion may include a first side extending in a first direction and a second side intersecting the first direction, and each of the peripheral partition portions may extend from at least one of the first side and the second side of the peripheral boundary portion.

In an embodiment, each of the plurality of peripheral partition portions may extend from the first side of the peripheral boundary portion in the first direction.

In an embodiment, some of the plurality of peripheral partition portions may protrude and extend from the first side of the peripheral boundary portion in a direction parallel to a second direction intersecting the first direction, and others of the plurality of peripheral partition portions may protrude and extend from the second side of the peripheral boundary portion in a direction parallel to the first direction.

In an embodiment, the peripheral partition portion may include a plurality of first sub-peripheral partition portions extend in a first direction, and disposed spaced apart in a second direction intersecting the first direction, and a plurality of second sub-peripheral partition portions extending in the second direction, and disposed spaced apart in the first direction, wherein the plurality of first sub-peripheral partition portions may intersect the plurality of second sub-peripheral partition portions.

In an embodiment, the peripheral partition portion may include first sub-peripheral partition portions surrounding the peripheral boundary portion and second sub-peripheral partition portions surrounding the first sub-peripheral partition portions.

In an embodiment, a display panel may include a display region and a peripheral region surrounding the display region. The display panel including a first region overlapping the display region, a second region overlapping a portion of the peripheral region, and a third region overlapping another portion of the peripheral region and disposed between the first region and the second region, a plurality of light emitting devices disposed in the first region, each of the plurality of light emitting devices including a plurality of cathode electrodes, a plurality conductive pattern layers disposed in the second region, a pixel boundary portion disposed in the first region, and electrically separating the plurality of cathode electrodes, a peripheral partition portion disposed in the second region, and separating the plurality of conductive pattern layers, and a plurality of voltage lines that provide a voltage to the plurality of light emitting devices, wherein each of the plurality of conductive pattern layers may be electrically connected to a corresponding one of the plurality of voltage lines.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain principles of the invention. In the drawings.

DETAILED DESCRIPTION OF THE EMBODIMENTS

Figure 1:
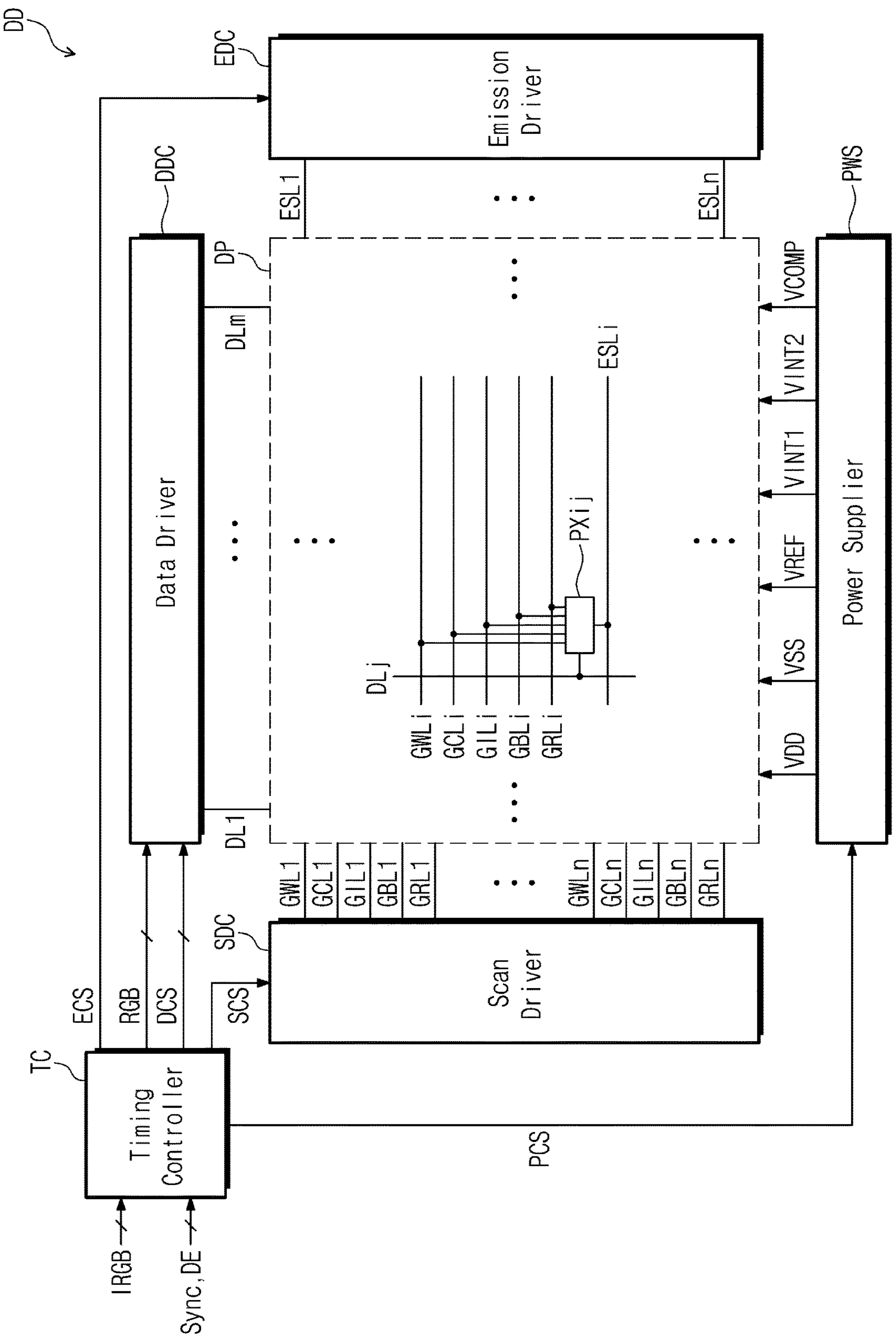
FIG. 1 is a schematic block diagram of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the accompanying drawings.

FIG. 1 is a schematic block diagram of a display device DD according to an embodiment.

Referring to FIG. 1, the display device DD may include a timing controller TC, a panel driver, and a display panel DP. In an embodiment, the display panel DP will be described as being a light emitting type display panel. The light emitting type display panel DP may include an organic light emitting display panel, an inorganic light emitting display panel, or a quantum dot light emitting display panel. In the following embodiment to be described, an organic light emitting display panel will be described as an example. The panel driver may include a scan driver SDC, an emission driver EDC, and a data driver DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include pixels PXij connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm. Here, m and n are integers greater than 1.

For example, a pixel PXij positioned at an i-th horizontal line (or, an i-th pixel row) and a j-th vertical line (or, a j-th pixel column) may be connected to an i-th first scan line GWLi, an i-th second scan line GCLi, an i-th third scan line GILi, an i-th fourth scan line GBLi, an i-th fifth scan line GRLi, a j-th data line DLj, and an i-th emission line ESLi. Here, i and j are integers greater than 1.

The pixel PXij may include transistors and capacitors. The pixel PXij may be supplied with a first power supply voltage VDD (or a first driving voltage), a second power supply voltage VSS (or a second driving voltage), a third power supply voltage VREF (or a reference voltage), a fourth power supply voltage VINT1 (or a first initialization voltage), a fifth power supply voltage VINT2 (or a second initialization voltage), and a sixth power supply voltage VCOMP (or a compensation voltage) through a power supplier PWS.

The voltage values of the first power supply voltage VDD and the second power supply voltage VSS may be set such that a current may flow in the light emitting device to emit light. For example, the first power supply voltage VDD may be set to a voltage higher than the second power supply voltage VSS.

The third power supply voltage VREF may be a voltage for initializing a gate of a driving transistor included in the pixel PXij. The third power supply voltage VREF may be used to implement a certain gray scale by using a voltage difference with a data signal. For example, the third power supply voltage VREF may be set to a certain voltage within a voltage range of the data signal.

The fourth power supply voltage VINT1 may be a voltage for initializing a capacitor included in the pixel PXij. The fourth power supply voltage VINT1 may be set to a voltage lower than the third power supply voltage VREF. For example, the fourth power supply voltage VINT1 may be set to a voltage lower than a difference between the third power supply voltage VREF and a threshold voltage Vth of the driving transistor. For example, the fourth power supply voltage VINT1 may be set to about 4 V to about 12 V. In case that the fourth power supply voltage VINT1 is set to a potential of about 4 V or greater, it may overcome characteristics of an N-type transistor. However, embodiments are not limited thereto.

The fifth power supply voltage VINT2 may be a voltage for initializing a cathode of a light emitting device LD (see FIG. 2A or FIG. 2B) included in the pixel PXij.

The sixth power supply voltage VCOMP may supply a certain current to the driving transistor in case that the threshold voltage of the driving transistor is compensated. The fifth power supply voltage VINT2 may be set to a voltage lower than the first power supply voltage VDD or the fourth power supply voltage VINT1 or may be set to a voltage similar to or the same as the third power supply voltage VREF, but embodiments are not limited thereto, and the fifth power supply voltage VINT2 may be set to a voltage similar to or the same as the first power supply voltage VDD.

FIG. 1 illustrates that the first to sixth power supply voltages VDD, VSS, VREF, VINT1, VINT2, and VCOMP are all supplied from the power supplier PWS, but embodiments are not limited thereto. For example, the first power supply voltage VDD and the second power supply voltage VSS may be all supplied regardless of a structure of the pixel PXij, and at least one of the third power supply voltage VREF, the fourth power supply voltage VINT1, the fifth power supply voltage VINT2, and the sixth power supply voltage VCOMP may not be supplied in correspondence to the structure of the pixel PXij.

In an embodiment, signal lines connected to the pixel PXij may be variously set in correspondence to a structure of the pixel PXij.

The scan driver SDC may receive a first control signal SCS from the timing controller TC, and may supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn based on the first control signal SCS.

The scan signal may be set to a gate-on voltage such that transistors which are supplied with the scan signal may be turned on.

For example, a scan signal supplied to a P-type transistor may be set to a logic low level, and a scan signal supplied to an N-type transistor may be set to a logic high level. Hereinafter, the meaning of "a scan signal is supplied" may be understood as that a scan signal is supplied at a logic level which turns on a transistor controlled by the scan signal.

In FIG. 1, for convenience of description, the scan driver SDC is illustrated as having a single configuration, but embodiments are not limited thereto. According to an embodiment, scan drivers may be included to supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The emission driver EDC may supply an emission signal to the emission lines ESL1 to ESLn based on a second control signal ECS. For example, the emission signal may be supplied sequentially to the emission lines ESL1 to ESLn.

Transistors connected to the emission lines ESL1 to ESLn may be formed as N-type transistors. For example, the emission signal supplied to the emission lines ESL1 to ESLn may be set to a gate-off voltage (e.g., a logic low level). Transistors receiving an emission signal may be turned off in case that the emission signal is supplied, and may be set to the state of being turned-on otherwise.

The second control signal ECS may include an emission start signal and clock signals, and the emission driver EDC may be implemented as a shift register which sequentially shifts the emission start signal in a pulse form using the clock signals so as to sequentially generate and output an emission signal in a pulse form.

The data driver DDC may receive a third control signal DCS and image data RGB from the timing controller TC. The data driver DDC may convert the image data RGB in a digital form into an analog data signal (e.g., a data signal). The data driver DDC may supply a data signal to the data lines DL1 to DLm in correspondence to the third control signal DCS.

The third control signal DCS may include a data enable signal which indicates the output of a valid data signal, a horizontal start signal, a data clock signal, and the like. For example, the data driver DDC may include a shift register that shifts a horizontal start signal in synchronization with a data clock signal to generate a sampling signal, a latch that latches the image data RGB in response to the sampling signal, a digital-to-analog converter (or, a decoder) that converts the latched image data (e.g., data in a digital form) into data signals in an analog form, and buffers (or, amplifiers) that output the data signals to the data lines DL1 to DLm.

The power supplier PWS may supply the first power supply voltage VDD, the second power supply voltage VSS, and the third power supply voltage VREF for driving the pixel PXij to the display panel DP. The power supplier PWS may supply at least one voltage of the fourth power supply voltage VINT1, the fifth power supply voltage VINT2, and the sixth power supply voltage VCOMP to the display panel DP.

Figure 2A:
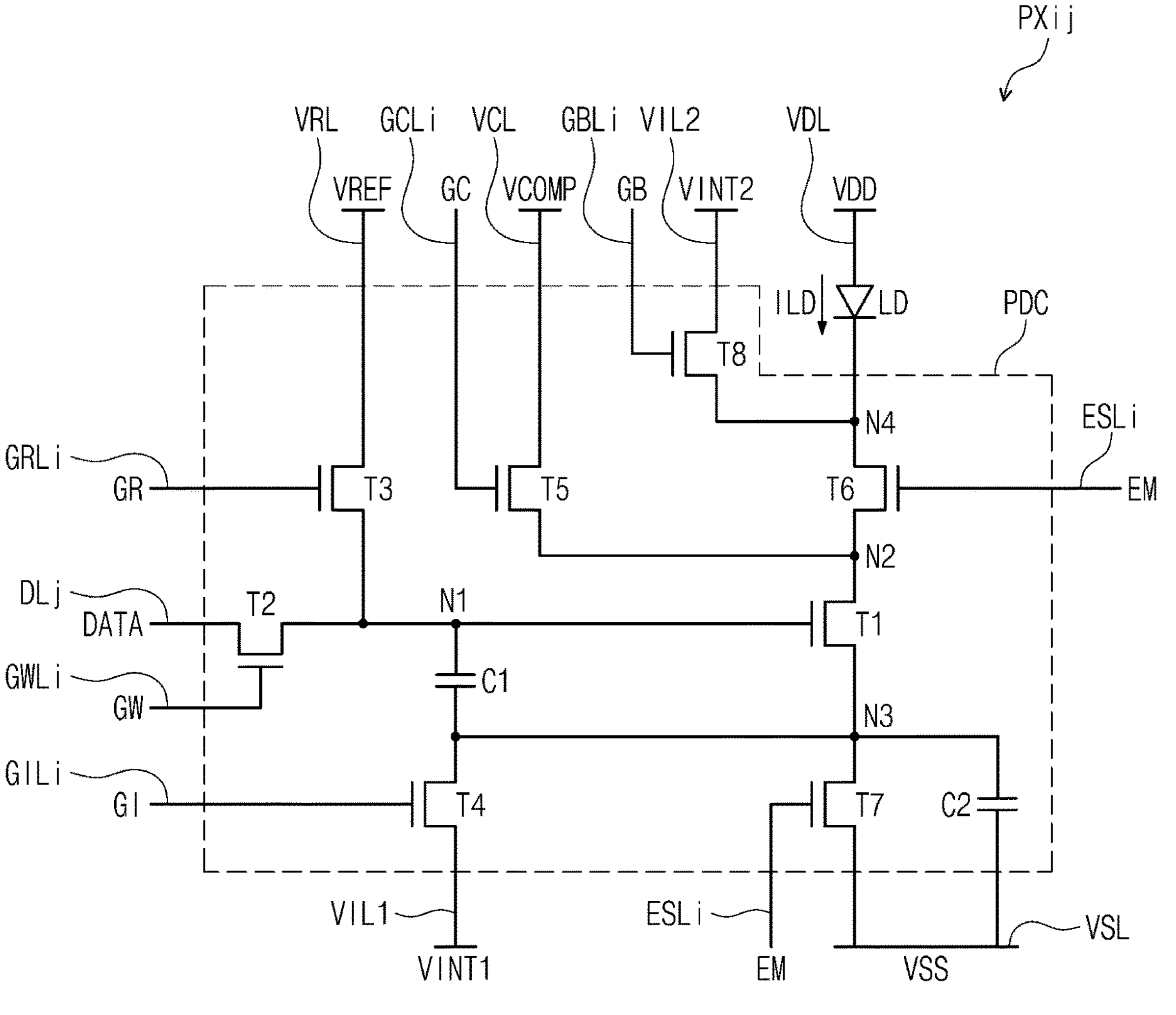
FIGS. 2A and 2B are schematic diagrams of equivalent circuits of a pixel according to an embodiment.

As an example, the power supplier PWS may respectively supply the first power supply voltage VDD, the second power supply voltage VSS, the third power supply voltage VREF, the fourth power supply voltage VINT1, the fifth power supply voltage VINT2, and the sixth power supply voltage VCOMP to the display panel DP via a first power line VDL (or a first driving voltage line), a second power line VSL (or a second driving voltage line), a third power line VRL (or a reference voltage line), a fourth power line VIL1 (or a first initialization voltage line), a fifth power line VIL2 (or a second initialization voltage line), and a sixth power line VCL (or a compensation voltage line), which are illustrated in FIG. 2A.

The power supplier PWS may be implemented as a power management IC (PMIC), but embodiments are not limited thereto.

The timing controller TC may generate the first control signal SCS, the second control signal ECS, the third control signal DCS, and a fourth control signal PCS based on input image data IRGB, a synchronization signal Sync (e.g., a vertical synchronization signal, a horizontal synchronization signal, etc.), a data enable signal DE, a clock signal, etc. The first control signal SCS may be supplied to the scan driver SDC, the second control signal ECS may be supplied to the emission driver EDC, the third control signal DCS may be supplied to the data driver DDC, and the fourth control signal PCS may be supplied to the power supplier PWS. The timing controller TC may generate the image data RGB (or, frame data) by rearranging the input image data IRGB in correspondence to an arrangement of the pixel PXij in the display panel DP.

For example, the scan driver SDC, the emission driver EDC, the data driver DDC, the power supplier PWS, and/or the timing controller TC may be formed (e.g., directly formed) in the display panel DP, or may be provided in the form of a separate driving chip and be connected to the display panel DP. For example, at least two among the scan driver SDC, the emission driver EDC, the data driver DDC, the power supplier PWS, and the timing controller TC may be provided as a driving chip (or a single driving chip). For example, the data driver DDC and the timing controller TC may be provided as a driving chip (or a single driving chip).

In the above, the display device DD according to an embodiment is described with reference to FIG. 1, but a display device is not limited thereto. Signal lines may be further added or omitted according to the configuration of a pixel. For example, the connection relationship between one pixel and signal lines may be changed. In case that any one of the signal lines is omitted, another signal line may replace the omitted signal line.

Figure 2B:
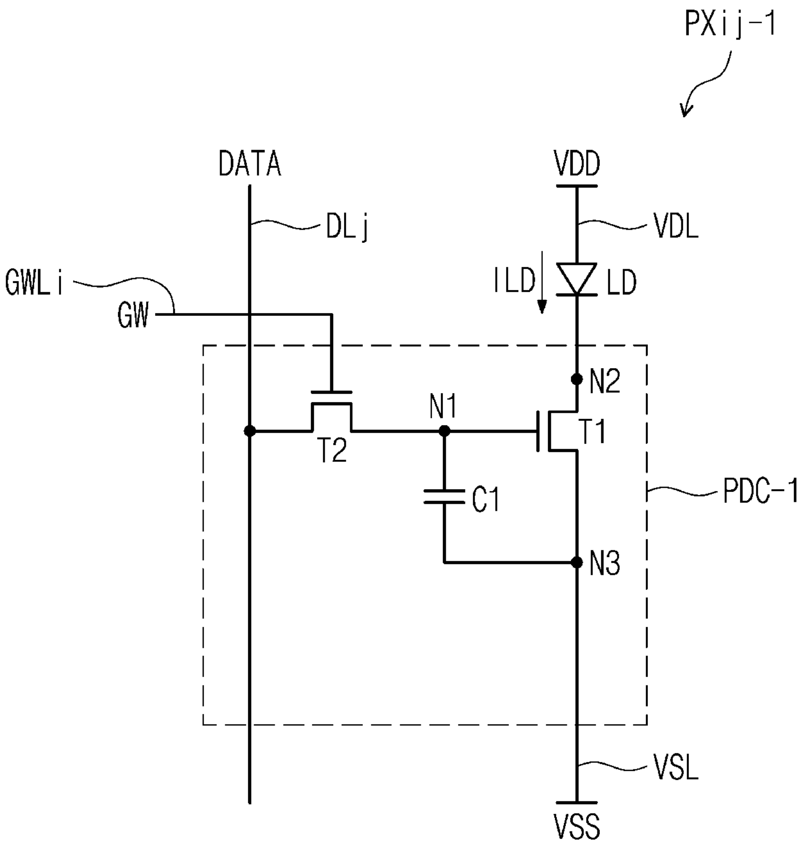

FIG. 2A and FIG. 2B are schematic diagrams of equivalent circuits of a pixel according to an embodiment. FIG. 2A and FIG. 2B illustrate schematic diagrams of equivalent circuits of pixels PXij and PXij−1 connected to the i-th first scan line GWLi (hereinafter, a first scan line) and connected to the j-th data line DLj (hereinafter, a data line).

As illustrated in FIG. 2A, the pixel PXij may include a light emitting device LD and a pixel driver PDC. The light emitting device LD may be connected to the first driving voltage line VDL and to the pixel driver PDC.

The pixel driver PDC may be connected to the scan lines GWLi, GCLi, GILi, GBLi, and GRLi, the data line DLj, the emission line ESLi, and the power voltage lines VDL, VSL, VIL1, VIL2, VRL, and VCL. The pixel driver PDC may include first to eighth transistors T1, T2, T3, T4, T5, T6, T7, and T8, a first capacitor C1, and a second capacitor C2. Hereinafter, a case in which each of the first to eighth transistors T1, T2, T3, T4, T5, T6, T7, and T8 is an N-type transistor will be described as an example. However, embodiments are not limited thereto, and some of the first to eighth transistors T1 to T8 may be N-type transistors, and the rest thereof may be P-type transistors, or each of the first to eighth transistors T1 to T8 may be a P-type transistor, and embodiments are not limited thereto.

A gate of the first transistor T1 may be connected to a first node N1. A first electrode of the first transistor T1 may be connected to a second node N2, and a second electrode thereof may be connected to a third node N3. The first transistor T1 may be a driving transistor. The first transistor T1 may control a driving current ILD flowing from the first driving voltage line VDL to the second driving voltage line VSL via light emitting device LD in correspondence to a voltage of the first node N1. For example, the first driving voltage VDD may be set to a voltage having a potential higher than that of the second driving voltage VSS.

In the disclosure, "being electrically connected between a transistor and a signal line or between a transistor and a transistor" means that "a source, a drain, and a gate of a transistor have an integral shape with a signal line or are connected through a connection electrode."

The second transistor T2 may include a gate connected to the first scan line GWLi, a first electrode connected to the data line DLj, and a second electrode connected to the first node N1. The second transistor T2 may supply a data signal DATA to the first node N1 in response to a write scan signal GW transmitted through the first scan line GWLi. The second transistor T2 may be a switching transistor. The second transistor T2 may be turned on in case that the write scan signal GW is supplied to the first scan line GWLi and electrically connect the data line DLj and the first node N1.

The third transistor T3 may be connected between the first node N1 and the reference voltage line VRL. A first electrode of the third transistor T3 may receive the reference voltage VREF through the reference voltage line VRL, and a second electrode of the third transistor T3 may be connected to the first node N1. In an embodiment, a gate of the third transistor T3 may receive a reset scan signal GR through the i-th fifth scan line GRLi (hereinafter, a fifth scan line). The third transistor T3 may be turned on in case that the reset scan signal GR is supplied to the fifth scan line GRLi and provide the reference voltage VREF to the first node N1.

The fourth transistor T4 may be connected between the third node N3 and the first initialization voltage line VIIl. A first electrode of the fourth transistor T4 may be connected to the third node N3, and a second electrode of the fourth transistor T4 may be connected to a first initialization voltage line VIL1 which provides the first initialization voltage VINT1. A gate of the fourth transistor T4 may receive an initialization scan signal GI through the i-th third scan line GILi (hereinafter, a third scan line). The fourth transistor T4 may be turned on in case that the initialization scan signal GI is supplied to the third scan line GILi and supply the first initialization voltage VINT1 to the third node N3.

The fifth transistor T5 may be connected between the compensation voltage line VCL and the second node N2. A first electrode of the fifth transistor T5 may receive the compensation voltage VCOMP through the compensation voltage line VCL, and a second electrode of the fifth transistor T5 may be connected to the second node N2 to be electrically connected to the first electrode of the first transistor T1. A gate of the fifth transistor T5 may receive a compensation scan signal GC through the i-th second scan line GCLi (hereinafter, a second scan line). The fifth transistor T5 may be turned on in case that the compensation scan signal GC is supplied to the second scan line GCLi and provide the compensation voltage VCOMP to the second node N2, and during a compensation period, a threshold voltage Vth of the first transistor T1 may be compensated.

The sixth transistor T6 may be connected between the first transistor T1 and the light emitting device LD. For example, a gate of the sixth transistor T6 may receive an emission signal EM through the i-th emission line ESLi (hereinafter, an emission line). A first electrode of the sixth transistor T6 may be connected to a cathode of the light emitting device LD through a fourth node N4, and a second electrode of the sixth transistor T6 may be connected to the first electrode of the first transistor T1 through the second node N2. The sixth transistor T6 may be referred to as a first emission control transistor. The sixth transistor T6 may be turned on in case that the emission signal EM is supplied to the emission line ESLi, and electrically connect the light emitting device LD and the first transistor T1.

The seventh transistor T7 may be connected between the second driving voltage line VSL and the third node N3. A first electrode of the seventh transistor T7 may be connected to the second electrode of the first transistor T1 through the third node N3, and a second electrode of the seventh transistor T7 may receive the second driving voltage VSS through the second driving voltage line VSL. A gate of the seventh transistor T7 may be electrically connected to the emission line ESLi. The seventh transistor T7 may be referred to as a second emission control transistor. The seventh transistor T7 may be turned on in case that the emission signal EM is supplied to the emission line ESLi, and electrically connect the second electrode of the first transistor T1 and the second driving voltage line VSL.

In an embodiment, the sixth transistor T6 and the seventh transistor T7 are illustrated as being connected to the same emission line ESLi and turned on through the same emission signal EM, but this is illustrated as an example, and the sixth transistor T6 and the seventh transistor T7 may be independently turned on by different signals distinguished from each other. For example, in the pixel driver PDC according to an embodiment, one of the sixth transistor T6 and the seventh transistor T7 may be omitted.

The eighth transistor T8 may be connected between the second initialization voltage line VIL2 and the fourth node N4. For example, the eighth transistor T8 may include a gate connected to the i-th fourth scan line GBLi (hereinafter, a fourth scan line), a first electrode connected to the second initialization voltage line VIL2, and a second electrode connected to the fourth node N4. The eighth transistor T8 may be referred to as a second initialization transistor. The eighth transistor T8 may supply the second initialization voltage VINT2 to the fourth node N4 corresponding to the cathode of the light emitting device LD in response to a black scan signal GB transmitted through the fourth scan line GBLi. The cathode of the light emitting device LD may be initialized by the second initialization voltage VINT2.

In an embodiment, some of the second to eighth transistors T2, T3, T4, T5, T6, T7, and T8 may be simultaneously turned on through the same scan signal. For example, the eighth transistor T8 and the fifth transistor T5 may be simultaneously turned on through the same scan signal. For example, the eighth transistor T8 and the fifth transistor T5 may be operated through the same compensation scan signal GC. The eighth transistor T8 and the fifth transistor T5 may be turned on/off by the same compensation scan signal GC, so that the eighth transistor T8 and the fifth transistor T5 may be simultaneously turned on/off. For example, the second scan line GCLi and the fourth scan line GBLi may be provided as substantially a single scan line. Accordingly, initializing the cathode of the light emitting device LD and compensating the threshold voltage of the first transistor T1 may be performed at the same timing. However, this is illustrated as an example, and embodiments are not limited thereto.

For example, according to an embodiment, the initialization the cathode of the light emitting device LD and the compensation the threshold voltage of the first transistor T1 may be achieved with the application of the same power voltage. For example, the compensation voltage line VCL and the second initialization voltage line VIL2 may be provided as substantially a single power voltage line. For example, since the initialization operation of a cathode and the compensation operation of a driving transistor may be performed with one power voltage, the design of a driver may be simplified. However, this is illustrated as an example, and embodiments are not limited thereto.

The first capacitor C1 may be disposed between the first node N1 and the third node N3. The first capacitor C1 may store a voltage difference between the first node N1 and the third node N3. The first capacitor C1 may be referred to as a storage capacitor.

The second capacitor C2 may be disposed between the third node N3 and the second driving voltage line VSL. For example, one electrode of the second capacitor C2 may be connected to the second driving voltage line VSL which is supplied with the second driving voltage VSS, and the other electrode of the second capacitor C2 may be connected to the third node N3. The second capacitor C2 may store a charge corresponding to a voltage difference between the second driving voltage line VSL and the third node N3. The second capacitor C2 may be referred to as a hold capacitor. The second capacitor C2 may have a higher storage capacity compared to the first capacitor C1. Accordingly, the second capacitor C2 may minimize a voltage change of the third node N3 in correspondence to a voltage change of the first node N1.

In an embodiment, the light emitting device LD may be connected to the pixel driver PDC through the fourth node N4. The light emitting device LD may include an anode connected to the first driving voltage line VDL and a cathode facing the anode. In an embodiment, the light emitting device LD may be connected to the pixel driver PDC through the cathode. For example, in the pixel PXij according to an embodiment, a connection node to which the light emitting device LD and the pixel driver PDC are connected may be the fourth node N4, and the fourth node N4 may correspond to a connection node between the first electrode of the sixth transistor T6 and the cathode of the light emitting device LD.

Accordingly, the potential of the fourth node N4 may substantially correspond to the potential of the cathode of the light emitting device LD. For example, the anode of the light emitting device LD may be connected to the first driving voltage line VDL and applied with the first driving voltage VDD, which is a constant voltage, and the cathode thereof may be connected to the first transistor T1 though the sixth transistor T6. For example, the potential of the second node N2 corresponding to a source of the first transistor T1 may not be directly affected by the characteristics of the light emitting device LD. Therefore, in case that the characteristics of the light emitting device LD are deteriorated due to the lifespan of the light emitting device LD and the like, the influence on transistors of the pixel driver PDC, e.g., a gate-source voltage Vgs of a driving transistor, may be reduced. For example, since a change amount of a driving current due to the deterioration of the light emitting device LD may be reduced, afterimage defects of the display panel due to an increase in usage time may be reduced and the lifespan thereof may be improved.

In another example, as illustrated in FIG. 2B, the pixel PXij−1 may include a pixel driver PDC−1 including two transistors T1 and T2 and one capacitor C1. The pixel driver PDC−1 may be connected to a light emitting device LD, a first scan line GWLi, a data line DLj, and a second driving voltage line VSL. The pixel driver PDC−1 illustrated in FIG. 2B may correspond to the pixel driver PDC illustrated in FIG. 2A from which the third to eighth transistors T3 to T8 and one capacitor C2 are omitted.

Each of the first and second transistors T1 and T2 may be an N-type transistor or a P-type transistor. In an embodiment, each of the first and second transistors T1 and T2 is described as an N-type transistor.

The first transistor T1 may include a gate connected to a first node N1, a first electrode connected to a second node N2, and a second electrode connected to a third node N3. The second node N2 may be a node connected to the side of a first driving voltage line VDL, and the third node N3 may be a node connected to the side of a second driving voltage line VSL. The first transistor T1 may be connected to light emitting device LD through the second node N2 and connected to the second driving voltage line VSL through the third node N3. The first transistor T1 may be a driving transistor.

The second transistor T2 may include a gate for receiving a write scan signal GW through the first scan line GWLi, a first electrode connected to the data line DLj, and a second electrode connected to the first node N1. The second transistor T2 may supply a data signal DATA to the first node N1 in response to the write scan signal GW transmitted through the first scan line GWLi.

The capacitor C1 may include an electrode connected to the first node N1 and an electrode connected to the third node N3. The capacitor C1 may store the data signal DATA transmitted to the first node N1.

The light emitting device LD may include an anode and a cathode. In an embodiment, the anode of the light emitting device LD may be connected to the first driving voltage line VDL, and the cathode thereof may be connected to the pixel driver PDC−1 through the second node N2. In an embodiment, the cathode of the light emitting device LD may be connected to the first transistor T1. The light emitting device LD may emit light in correspondence to an amount of current flowing in the first transistor T1 of the pixel driver PDC−1.

The second node N2 to which the cathode of light emitting device LD and the pixel driver PDC−1 are connected may correspond to a drain of the first transistor T1. The light emitting device LD may be connected to the pixel driver PDC−1 through the second node N2. For example, in the pixel PXij−1 illustrated in FIG. 2B, a connection node to which the light emitting device LD and the pixel driver PDC−1 are connected may be the second node N2, and the second node N2 may correspond to a connection node between the first electrode of the first transistor T1 and the cathode of the light emitting device LD.

For example, in case that the driving transistor is an N-type transistor, the display panel may prevent a change in a gate-source voltage of the first transistor T1 caused by the light emitting device LD. Accordingly, since a change amount of a driving current due to the deterioration of the light emitting device LD may be reduced, afterimage defects of the display panel due to an increase in usage time may be reduced and the lifespan thereof may be improved.

For example, FIG. 2A and FIG. 2B illustrate circuits for the pixel drivers PDC and PDC−1 according to an embodiment, and as long as a display panel according to an embodiment is a circuit connected to the cathode of the light emitting device LD, the number or arrangement relationship of transistors and the number or arrangement relationship of capacitors may be designed in various ways, but embodiments are not limited thereto.

Figure 3A:
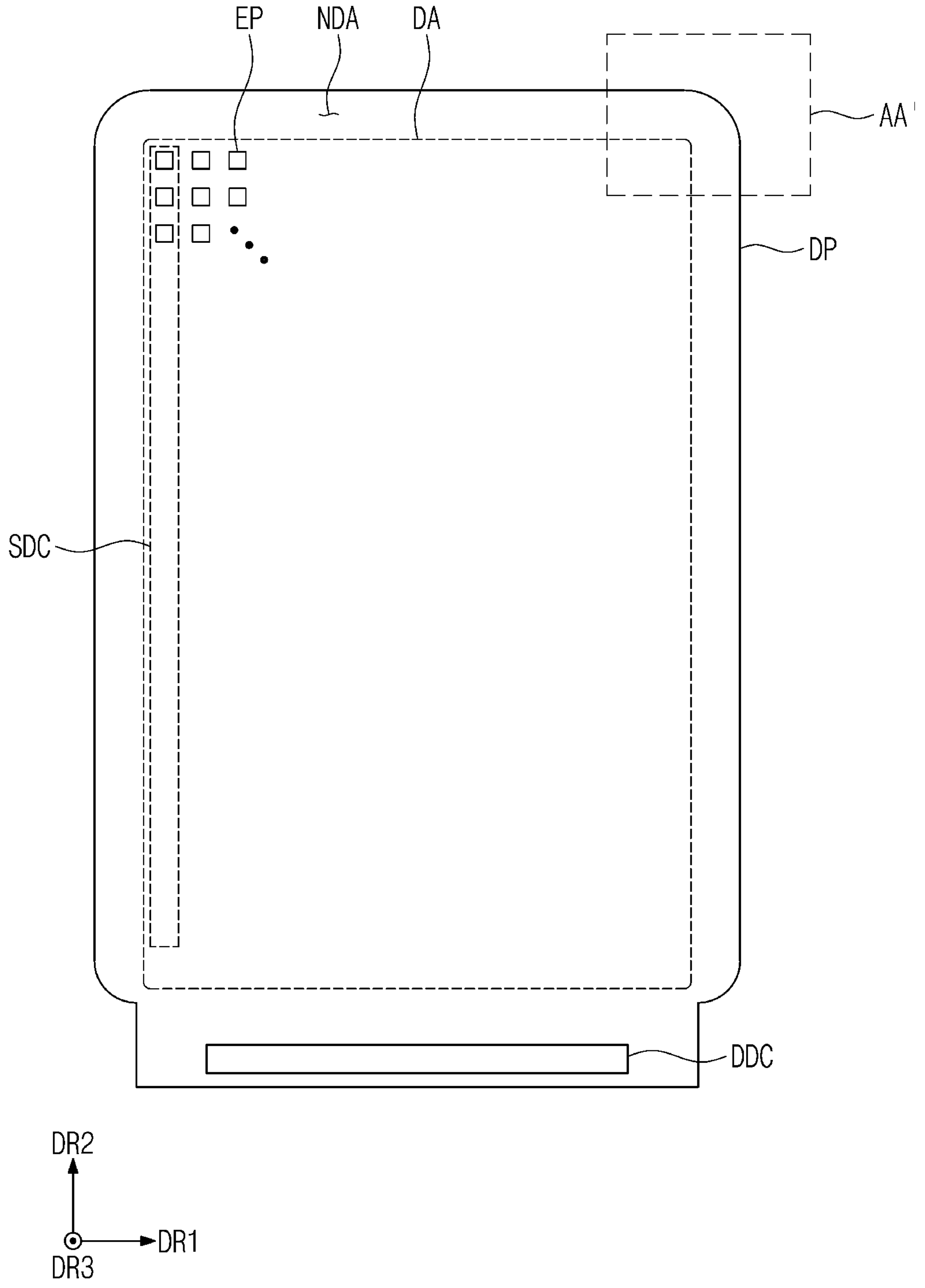
FIGS. 3A and 3B are schematic plan views of display devices according to an embodiment.
Figure 3B:
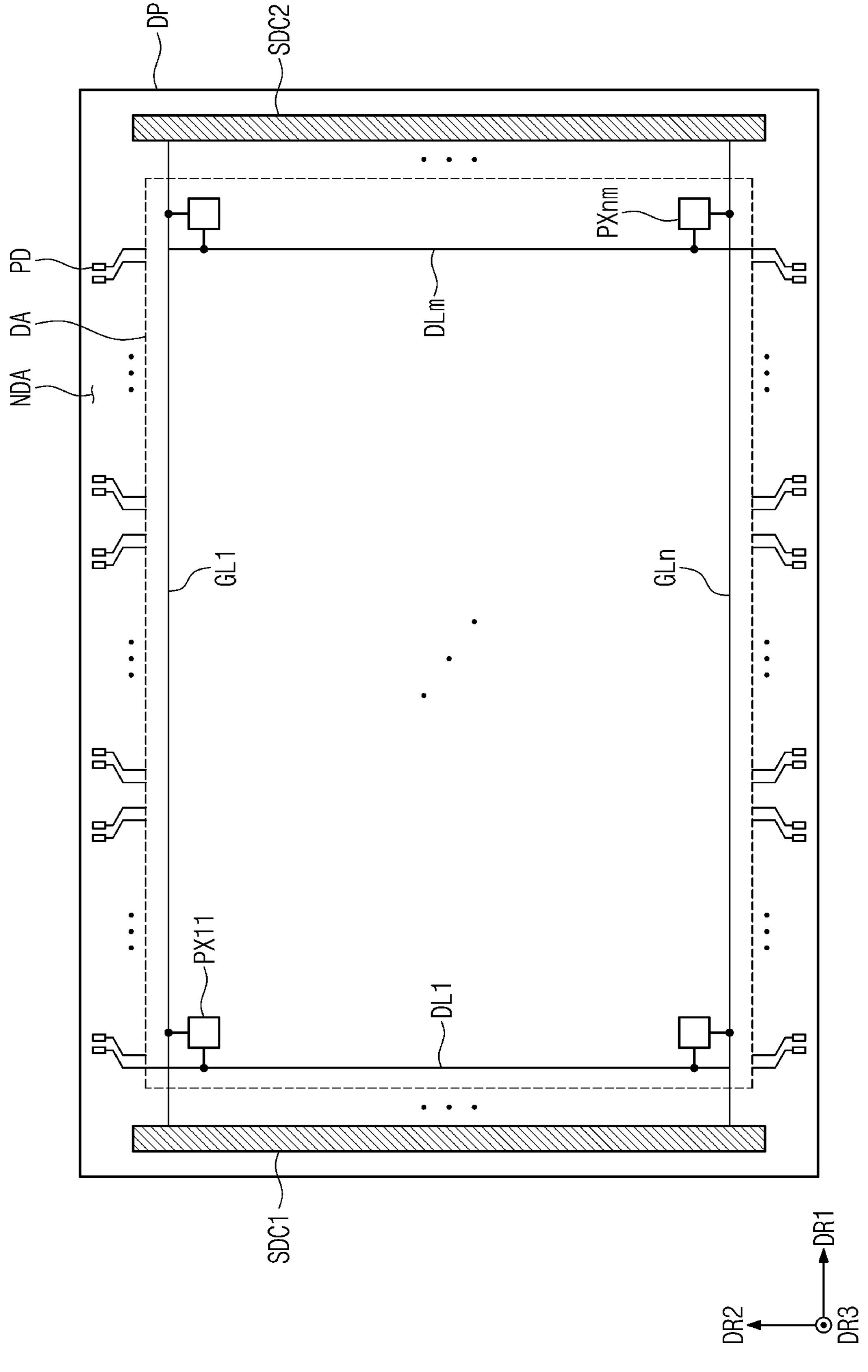

FIG. 3A and FIG. 3B are schematic plan views of display devices according to an embodiment. In each of FIG. 3A and FIG. 3B, some components are omitted. Hereinafter, an embodiment will be described with reference to FIG. 3A and FIG. 3B. Referring to FIG. 3A, the display panel DP of an embodiment may be divided into a display region DA and a peripheral region NDA. The display region DA may include emitting parts EP.

The emitting parts EP may be regions emitted by the pixels PXij (see FIG. 1), respectively. For example, each of the emitting parts EP may correspond to a light emitting opening OP-PDL to be described below.

The peripheral region NDA may be disposed adjacent to the display region DA. In an embodiment, the peripheral region NDA is illustrated as having a shape surrounding the display region DA. However, this is an example, and the peripheral region NDA may be disposed on a side of the display region DA, or may be omitted, but embodiments are not limited thereto.

In an embodiment, the scan driver SDC and the data driver DDC may be mounted on the display panel DP. In an embodiment, the scan driver SDC may be disposed in the display region DA, and the data driver DDC may be disposed in the peripheral region NDA. The scan driver SDC may overlap at least some of the emitting parts EP disposed in the display region DA on a plane (or in a plan view). Since the scan driver SDC is disposed in the display region DA, the area of the peripheral region NDA may be reduced in an embodiment as compared to a typical display panel in which a scan driver is disposed in a peripheral region, and a display device with a narrow bezel may be readily implemented.

For example, in FIG. 3A, a scan driver SDC (e.g., a single scan driver) is illustrated, but embodiments are not limited thereto. For example, the scan driver SDC may be provided as two portions/parts separated from each other. The two scan drivers SDC may be disposed spaced apart from each other left and right with the center portion of the display region DA interposed therebetween. In another example, the scan driver SDC may be provided in a number equal to or greater than 2, but embodiments are not limited thereto.

For example, FIG. 3A illustrates an example of a display device, and the data driver DDC may be disposed in the display region DA. For example, some of the emitting parts EP disposed in the display region DA may overlap the data driver DDC on a plane (or in a plan view).

The data driver DDC may be provided in the form of a separate driving chip independent from the display panel DP and be connected to the display panel DP. However, this is described as an example, and the data driver DDC may be formed in a process, which is the same as the process in which the scan driver SDC is formed so as to form the display panel DP, but embodiments are not limited thereto.

In another example, as illustrated in FIG. 3B, the display device may include a display panel having a longer side in a first direction DR1. In an embodiment, the display device may include scan drivers SDC1 and SDC2. The scan drivers SDC1 and SDC2 are illustrated as including a first scan driver SDC1 and a second scan driver SDC2 disposed spaced apart from each other in the first direction DR1.

The first scan driver SDC1 may be connected to some of scan lines GL1 to GLn, and the second scan driver SDC2 may be connected to others of the scan lines GL1 to GLn. For example, the first scan driver SDC1 may be connected odd-numbered scan lines GL1 to GL2*n*-1 among the scan lines GL1 to GLn, and the second scan driver SDC2 may be connected even-numbered scan lines GL2 to GL2*n* among the scan lines GL1 to GLn. The display panel DP may include pixels PX11 to PXnm, which are connected to the scan lines GL1 to GLn and the data lines DL1 to DLm and are disposed in the display region DA.

For convenience of description, FIG. 3B illustrates pads PD of the data lines DL1 to DLm. The pads PD may be defined at end portions of the data lines DL1 to DLm. The data lines DL1 to DLm may be connected to the data driver DDC (see FIG. 3A) through the pads PD.

According to an embodiment, the pads PD may be divided and arranged at positions spaced apart from each other with the display region DA interposed therebetween in the peripheral region NDA. For example, some of the pads PD may be disposed on an upper side, e.g., a side adjacent to the first scan line GL1 among the scan lines GL1 to GLn, and others of the pads PD may be disposed on a lower side, e.g., a side adjacent to the last scan line GLn among the scan lines GL1 to GLn. In an embodiment, among the pads PD, pads connected to odd-numbered data lines DL1 to DL2*m*−1 may be disposed on an upper side, and among the pads PD, pads connected to even-numbered data lines DL2 to DL2*m* may be disposed on a lower side. For example, the data driving unit may include three upper data drivers connected to the pads PD disposed on an upper side and three lower data drivers connected to the pads PD disposed on a lower side. However, this is described as an example, and the pads PD according to an embodiment may be connected through two data drivers respectively provided on the upper side and the lower side. In another example, the pads PD according to an embodiment may be disposed on any one side and connected to a single data driver, but embodiments are not limited thereto.

Figure 4A:
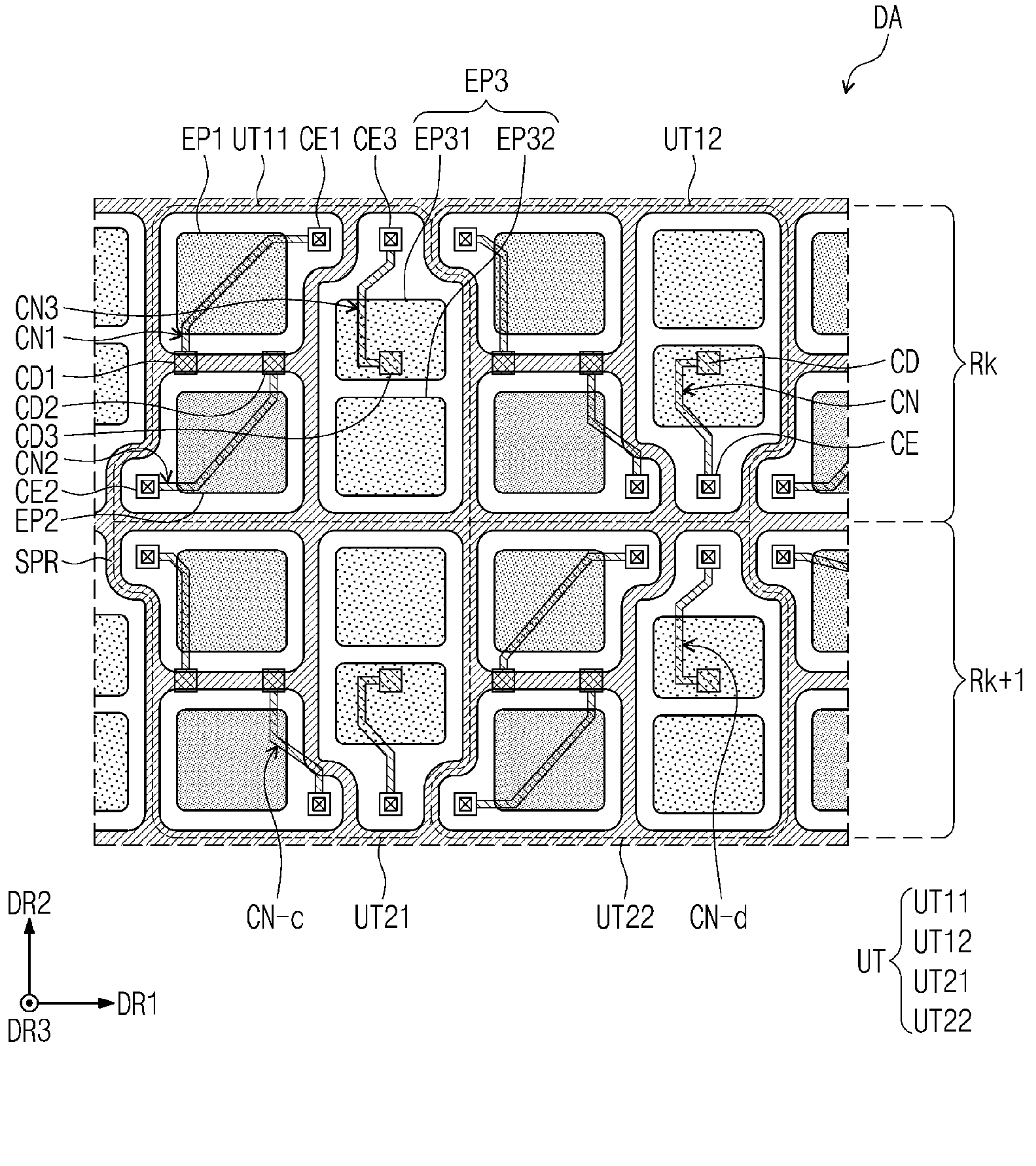
FIGS. 4A, 4B, and 4C are schematic plan views of some enlarged regions of a display panel according to an embodiment.
Figure 4B:
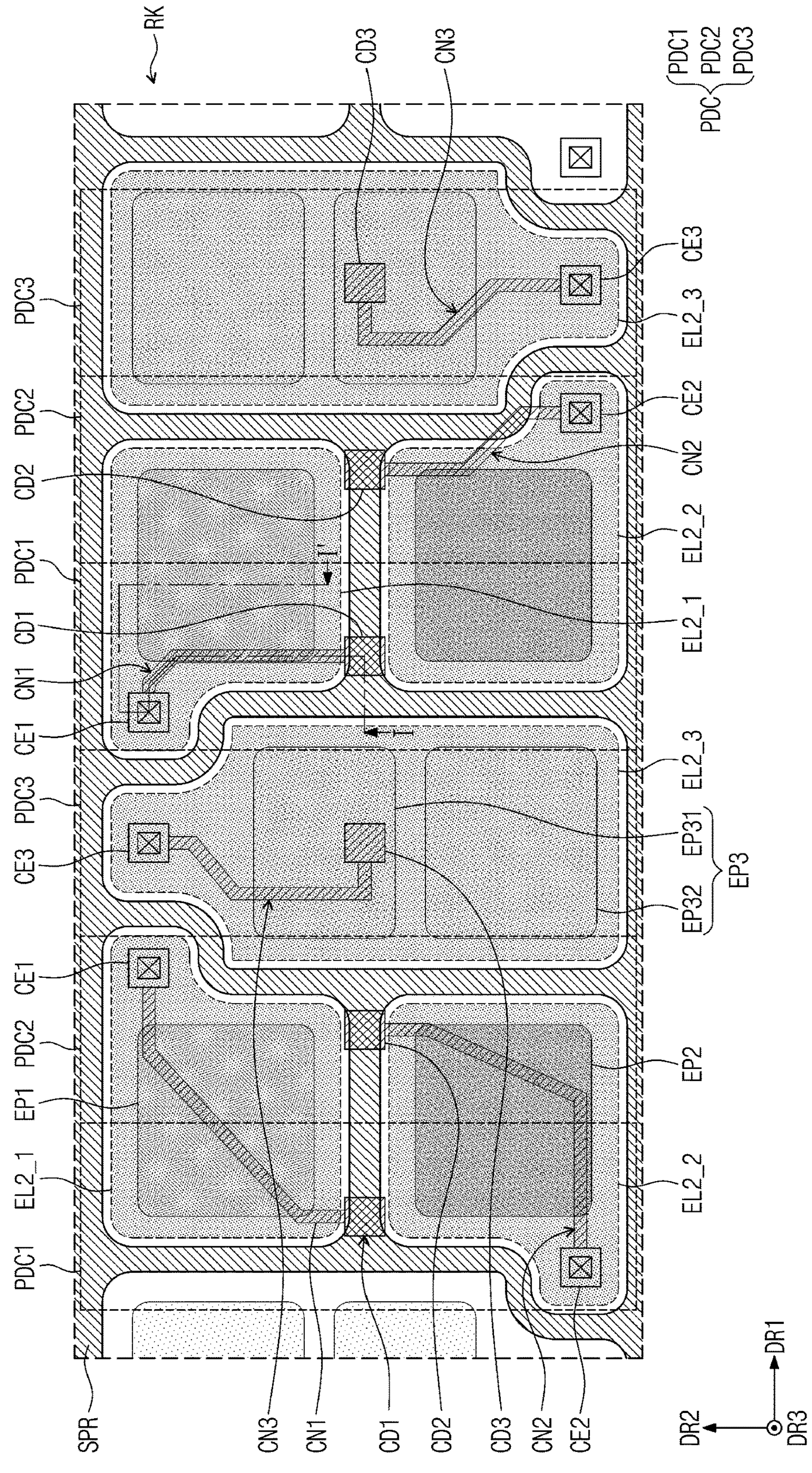
Figure 4C:
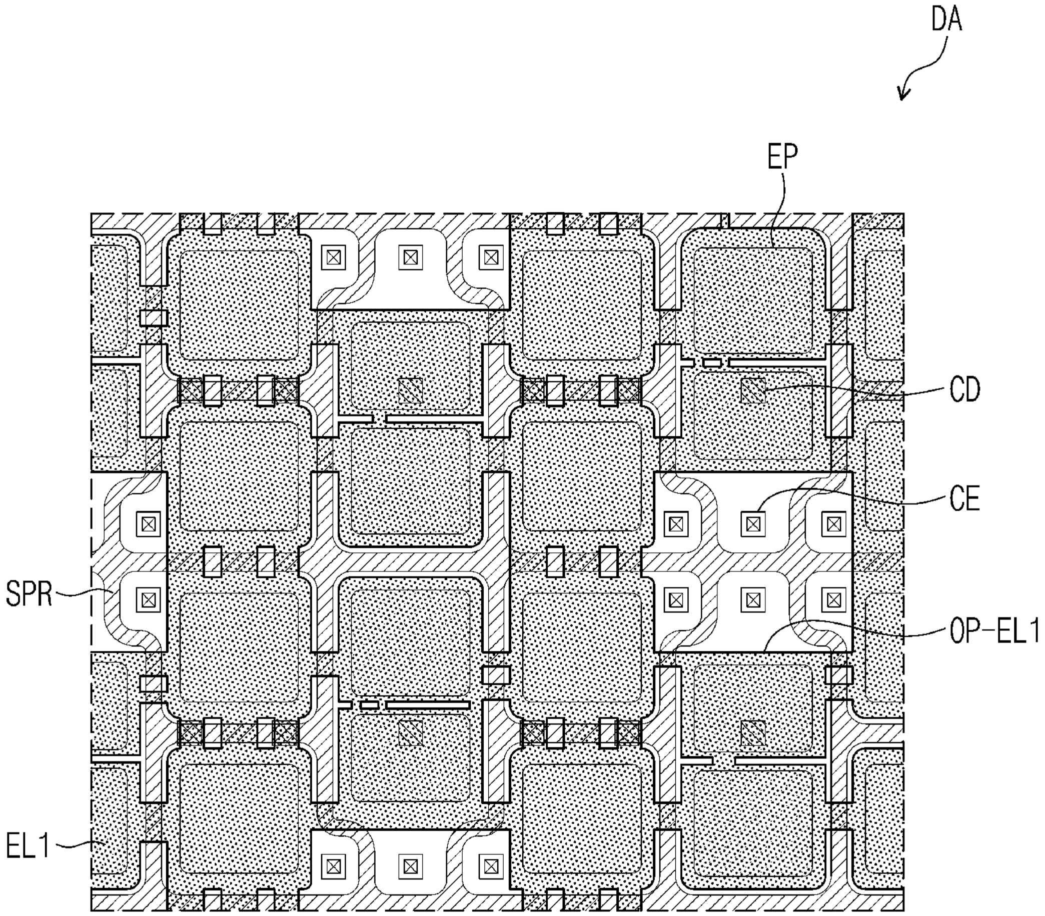

FIG. 4A to FIG. 4C are schematic plan views of some enlarged regions of a display panel according to an embodiment. FIG. 4A illustrates a region in which a total of four light emitting units UT in two rows and two columns are disposed, and FIG. 4B illustrates enlarged emitting parts of a first row Rk illustrated in FIG. 4A. FIG. 4C, some components of the components illustrated in FIG. 4A are omitted or emphasized. Hereinafter, with reference to FIG. 4A to FIG. 4C, an embodiment will be described.

FIG. 4A illustrates light emitting units UT11, UT12, UT21, and UT22 in 2 rows and 2 columns. Emitting parts of the first row Rk may include emitting parts of a first-row first-column light emitting unit UT11 and a first-row second-column light emitting unit UT12, and emitting parts of a second row Rk+1 may include emitting parts of a second-row first-column light emitting unit UT21 and a second-row second-column light emitting unit UT22. Among components of a display panel, FIG. 4A to FIG. 4C illustrate a separator SPR, emitting parts EP1, EP2, and EP3 disposed in a region partitioned by the separator SPR, connection wirings CN1, CN2, and CN3, a first electrode EL1, and second electrodes EL2_1, EL2_2, and EL2_3.

As described above, each of the emitting parts EP1, EP2, and EP3 may correspond to a light emitting opening OP-PDL (see FIG. 5) to be described below. For example, each of the emitting parts EP1, EP2, and EP3 may be regions from which light is emitted by the above-described light emitting device, and may correspond to a unit displaying an image displayed on the display panel DP. For example, each of the emitting parts EP1, EP2, and EP3 may correspond to a region defined by the light emitting opening OP-PDL to be described below, e.g., a region defined by a lower surface of the light emitting opening OP-PDL.

The emitting parts EP1, EP2, and EP3 may include a first emitting part EP1, a second emitting part EP2, and a third emitting part EP3. The first emitting part EP1, the second emitting part EP2, and the third emitting part EP3 may emit light of different colors from each other. For example, the first emitting part EP1 may emit red light, the second emitting part EP2 may emit green light, the third emitting part EP3 may emit blue light, but the combination of colors is not limited thereto. For example, two or more among the emitting parts EP1, EP2, and EP3 may emit light of the same color. For example, all of the first to third emitting parts EP1, EP2, and EP3 may emit blue light, or all thereof may emit white light.

For example, among the emitting parts EP1, EP2, and EP3, the third emitting part EP3 which displays light emitted by a third light emitting device may include two sub-emitting parts EP31 and EP32 spaced apart from each other in a second direction DR2. However, this is illustrated as an example, and the third emitting part EP3 may be provided as a pattern having a shape of a single body like the other emitting parts EP1 and EP2, or at least one of the other emitting parts EP1 and EP2 may include sub-emitting parts, but embodiments are not limited thereto.

In an embodiment, the emitting parts of the first row Rk may be formed as emitting parts in the form in which the first-row first-column light emitting unit UT11 and the first-row second-column light emitting unit UT12 are repeatedly arranged. The emitting parts of the second row Rk+1 may be formed as emitting parts in which the emitting parts of the first row Rk have shapes and arrangements line-symmetrical with respect to an axis parallel to the first direction DR1. Accordingly, shapes and arrangement forms/patterns, in which the emitting parts of the first-row first-column light emitting unit UT11 and the first-row second-column light emitting unit UT12 and connected portions of the connection wirings are line-symmetrical with respect to an axis parallel to the first direction DR1, may correspond to those of emitting parts of the second-row first-column light emitting unit UT21 and the second-row second-column light emitting unit UT22 and connected portions of connection wirings.

Hereinafter, the first-row first-column light emitting unit UT11 will be described. For convenience of description, FIG. 4B illustrates second electrodes EL2_1, EL2_2, and EL2_3, pixel drivers PDC, and connection wirings CN. The second electrodes EL2_1, EL2_2, and EL2_3 may be distinguished/defined by the separator SPR. In an embodiment, a light emitting unit (or a single light emitting unit) UT may include three emitting parts EP1, EP2, and EP3. Accordingly, the light emitting unit UT may include three second electrodes EL2_1, EL2_2, and EL2_3 (hereinafter, first, second, and third cathodes), three pixel drivers PDC1, PDC2, and PDC3, and three connection wirings CN1, CN2, and CN3. However, this is illustrated as an example, and the number and arrangement of the light emitting unit UT may be designed in various ways, but embodiments are not limited thereto.

The first to third pixel drivers PDC1, PDC2, and PDC3 may be connected to light emitting devices forming the first to third emitting parts EP1, EP2, and EP3, respectively. In the disclosure, "connected" includes not only a case of being connected by direct physical contact, but also a case of being electrically connected.

The first to third pixel drivers PDC1, PDC2, and PDC3 may be sequentially disposed along the first direction DR1. For example, disposition positions of the first to third pixel drivers PDC1, PDC2, and PDC3 may be designed independently of positions or shapes of the first to third emitting parts EP1, EP2, and EP3.

For example, the first to third pixel drivers PDC1, PDC2, and PDC3 may be disposed in a region partitioned by the separator SPR, e.g., may be disposed at positions different from positions at which the first to third cathodes EL2_1, EL2_2, and EL2_3 are disposed, or may be designed to have an area of a shape different from the shape of the first to third cathodes EL2_1, EL2_2, and EL2_3. In another example, the first to third pixel drivers PDC1, PDC2, and PDC3 may be disposed to respectively overlap positions at which the first to third emitting parts EP1, EP2, and EP3 are formed and be disposed in a region partitioned by the separator SPR, for example, may be designed in a shape having an area similar to that of the first to third cathodes EL2_1, EL2_2, and EL2_3.

In an embodiment, each of the first to third pixel drivers PDC1, PDC2, and PDC3 is illustrated in a rectangular shape, and each of the first to third emitting parts EP1, EP2, and EP3 is arranged in a different form with a smaller area, and the first to third cathodes EL2_1, EL2_2, and EL2_3 are disposed at positions overlapping the first to third emitting parts EP1, EP2, and EP3 but are illustrated in atypical shapes.

Accordingly, as illustrated in FIG. 4B, the first pixel driver PDC1 may be disposed at a position partially overlapping the first emitting part EP1, the second emitting part EP2, and another adjacent light emitting unit. The second pixel driver PDC2 may be disposed at a position overlapping the first emitting part EP1, the second emitting part EP2, and the third emitting part EP3. The third pixel driver PDC3 may be disposed at a position overlapping the third emitting part EP3. For example, this is illustrated as an example, and the positions of the first to third pixel drivers PDC1, PDC2, and PDC3 may be designed in various forms and arrangements independently of the emitting parts EP1, EP2, and EP3, but embodiments are not limited thereto.

The connection wiring CN may be provided in plurality and disposed spaced apart from each other. The connection wiring CN may connect a pixel driver and a light emitting device. For example, the connection wiring CN may correspond to a node (e.g., the fourth node N4 of FIG. 2A or the second node N2 of FIG. 2B) at which the light emitting device LD (see FIG. 5) is connected to the pixel drivers PDC.

The connection wiring CN may include a first connection part CE (hereinafter, an emission connection part) and a second connection part CD (hereinafter, a driver connection part). The emission connection part CE may be provided on a side of the connection wiring CN, and the driver connection part CD may be provided on another side of the connection wiring CN.

The driver connection part CD may be a portion of the connection wiring CN that is connected to the pixel driver PDC. In an embodiment, the driver connection part CD may be connected to an electrode of a transistor of the pixel driver PDC. For example, the driver connection part CD may be connected to a drain of the sixth transistor T6 illustrated in FIG. 2A or the drain of the first transistor T1 illustrated in FIG. 2B. Accordingly, the position of the driver connection part CD may correspond to the position of a transistor TR (see FIG. 5) physically connected to the connection wiring CN of the pixel driver. The emission connection part CE may be a portion of the connection wiring CN that is connected to a light emitting device. In an embodiment, the emission connection part CE may be connected to the second electrode EL2 (hereinafter, a cathode, see FIG. 5) of the light emitting device.

The light emitting unit UT may include first to third connection wirings CN1, CN2, and CN3. The first connection wiring CN1 may connect a light emitting device forming the first emitting part EP1 and the first pixel driver PDC1, the second connection wiring CN2 may connect a light emitting device forming the second emitting part EP2 and the second pixel driver PDC2, and the third connection wiring CN3 may connect a light emitting device forming the third emitting part EP3 and the third pixel driver PDC3.

For example, the first to third connection wirings CN1, CN2, and CN3 may connect the first to third cathodes EL2_1, EL2_2, and EL2_3, and the first to third pixel drivers PDC1, PDC2, and PDC3, respectively. The first connection wiring CN1 may include a first driver connection part CD1 connected to the first pixel driver PDC1 and a first emission connection part CE1 connected to the first cathode EL2_1. The second connection wiring CN2 may include a second driver connection part CD2 connected to the second pixel driver PDC2 and a second emission connection part CE2 connected to the second cathode EL2_2. The third connection wiring CN3 may include a third driver connection part CD3 connected to the third pixel driver PDC3 and a third emission connection part CE3 connected to the third cathode EL2_3.

The first to third driver connection parts CD1, CD2, and CD3 may be arranged along the first direction DR1. As described above, the first to third driver connection parts CD1, CD2, and CD3 may correspond to positions of connection transistors of the first to third pixel drivers PDC1, PDC2, and PDC3, respectively. In a pixel, a connection transistor may be a transistor including, as one electrode, a connection node to which a pixel driver and a light emitting device are connected, and may correspond to, for example, the sixth transistor T6 of FIG. 2A or the first transistor T1 of FIG. 2B. According to an embodiment, by designing a pixel driver identically for all pixels regardless of the shape, size, and light emitting color of an emitting part, it is possible to simplify processes and reduce costs.

In an embodiment, the first to third emission connection parts CE1, CE2, and CE3 may be defined at positioned not overlapping the emitting parts EP1, EP2, and EP3 on a pane. As described above, each of the emission connection parts CE1, CE2, and CE3 may be provided at a position not overlapping the light emitting opening OP-PDL (see FIG. 5), since the emission connection part CE (see FIG. 5) of the connection wiring CN is a portion to which the light emitting device LD (see FIG. 5) is connected and a portion in which a tip part TP (see FIG. 5) is defined. For example, in each of the cathodes EL2_1, EL2_2, and EL2_3, the emission connection parts CE1, CE2, and CE3 may be disposed at positions spaced apart from the emitting parts EP1, EP2, and EP3, and the cathodes EL2_1, EL2_2, and EL2_3 may include some regions protruding from the emitting parts EP1, EP2, and EP3 on a plane (or in a plan view) in order to be connected to the connection wirings CN1, CN2, and CN3 at the positions at which the emission connection parts CE1, CE2, and CE3 are disposed.

For example, the first cathode EL2_1 may include a protruding portion in a shape protruding from the first emitting part EP1 at a position not overlapping the first emitting part EP1 in order to be connected to the first connection wiring CN1 at a position at which the first emission connection part CE1 is disposed, and the emission connection part CE1 may be provided in the protruding portion. Accordingly, the first emission connection part CE1 which may be connected to the first connection wiring CN1 may be provided without reducing the light emitting area of the first emitting part EP1.

As described above, the connection wiring CN may include the emission connection part CE and the driver connection part CD. The first pixel driver PDC1, e.g., the first driver connection part CD1 which is connected to the transistor TR, may be defined at a position not overlapping the first emitting part EP1 on a plane (or in a plan view). According to an embodiment, since the first connection wiring CN1 is disposed in the first emitting part EP1, the first cathode EL2_1 and the first pixel driver PDC1 spaced apart from each other may be readily connected.

The third pixel driver PDC3, e.g., the third driver connection part CD3, which is a position connected to the transistor TR, may be defined at a position not overlapping the third emission connection part CE3 on a plane (or in a plan view) and may be disposed at a position overlapping the third emitting part EP3. According to an embodiment, since the third cathode EL2_3 and the third pixel driver PDC3 are connected through the third connection wiring CN3, in case that the position of the third driver connection part CD3 overlaps the third emitting part EP3 on a plane (or in a plan view), the connection between the third pixel driver PDC3 and the third cathode EL2_3 may be facilitated/implemented. Accordingly, restrictions according to the position or shape of the third emitting part EP3 in the design of the pixel driver PDC3 may be reduced, and the degree of freedom in circuit design may be improved.

Referring back to FIG. 4A, the emitting parts of the second row Rk+1 may be formed as emitting parts in which the first-row light emitting units UT11 and UT12 have shapes and arrangements line-symmetrical with respect to an axis parallel to the first direction DR1. For example, due to the relationship between the first-row light emitting units UT11 and UT12, the second-row light emitting units UT21 and UT22 may substantially be formed as light emitting units in a form in which the first-row light emitting units UT11 and UT12 are shifted in the first direction DR1. For example, the second-row first-column light emitting unit UT21 may be formed as emitting parts having the same shape as that of the first-row second-column light emitting unit UT12, and the second-row second-column light emitting unit UT22 may be formed as a light emitting unit having the same shape as that of the first-row first-column light emitting unit UT11.

Accordingly, the shape and arrangement form of connection wirings CN-c disposed in the second-row first-column light emitting unit UT21 may be the same as those of connection wirings CN1, CN2, and CN3 disposed in the first-row second-column light emitting unit UT12. For example, the shape and arrangement form of connection wirings CN-d disposed in the second-row second-column light emitting unit UT22 may be the same as those of connection wirings CN1, CN2, and CN3 disposed in the first-row first-column light emitting unit UT11.

For example, referring to FIG. 4C, the first electrode EL1 (hereinafter, an anode) of a light emitting device according to an embodiment may be commonly provided to the emitting parts EP1, EP2, and EP3. For example, the anode EL1 may be provided in a shape of a single body and be disposed to overlap emitting parts or the separator SPR. As described above, the first driving voltage VDD (see FIG. 1) may be applied to the anode EL1 and a common voltage may be provided to all of the emitting parts. The anode EL1 may be connected to the first driving voltage line VDL (see FIG. 2A) providing the first driving voltage VDD in the peripheral region NDA (see FIG. 3A or FIG. 3B), or may be connected to the first driving voltage line VDL in the display region DA, but embodiments are not limited thereto.

For example, openings OP-EL1 may be defined in the anode EL1 according to an embodiment, and the openings OP-EL1 may pass through the anode EL. The openings OP-EL1 may be disposed at positions not overlapping emitting parts, and may generally be defined at positions overlapping the separator SPR. The openings OP-EL1 may facilitate/function the discharge of a gas generated from an organic layer disposed on a lower side of the anode EL1, for example, a sixth insulation layer 60 (see FIG. 5) to be described below. Accordingly, in the process of manufacturing the display panel DP, the gas of the organic layer may be sufficiently discharged, and thereafter, the problem of deterioration of the light emitting device LD caused by the gas discharged from the organic layer may be solved.

According to an embodiment, unlike emitting parts of which a cathode overlaps a connection transistor of a corresponding pixel driver on a plane (or in a plan view), emitting parts including a cathode having a shape not overlapping a connection transistor of a pixel driver may be readily connected to the pixel driver by further including a connection wiring. According to an embodiment, by further including a connection wiring, a light emitting device may be stably connected to a pixel driver by changing only the shape of a cathode without changing the design of emitting parts. Accordingly, the influence of arrangement or shape of emitting parts on the connection with the pixel driver may be reduced, so that the degree of freedom in designing the disposition of the pixel driver may be improved and the degradation in the aperture ratio of an emitting part may be prevented.

Figure 5:
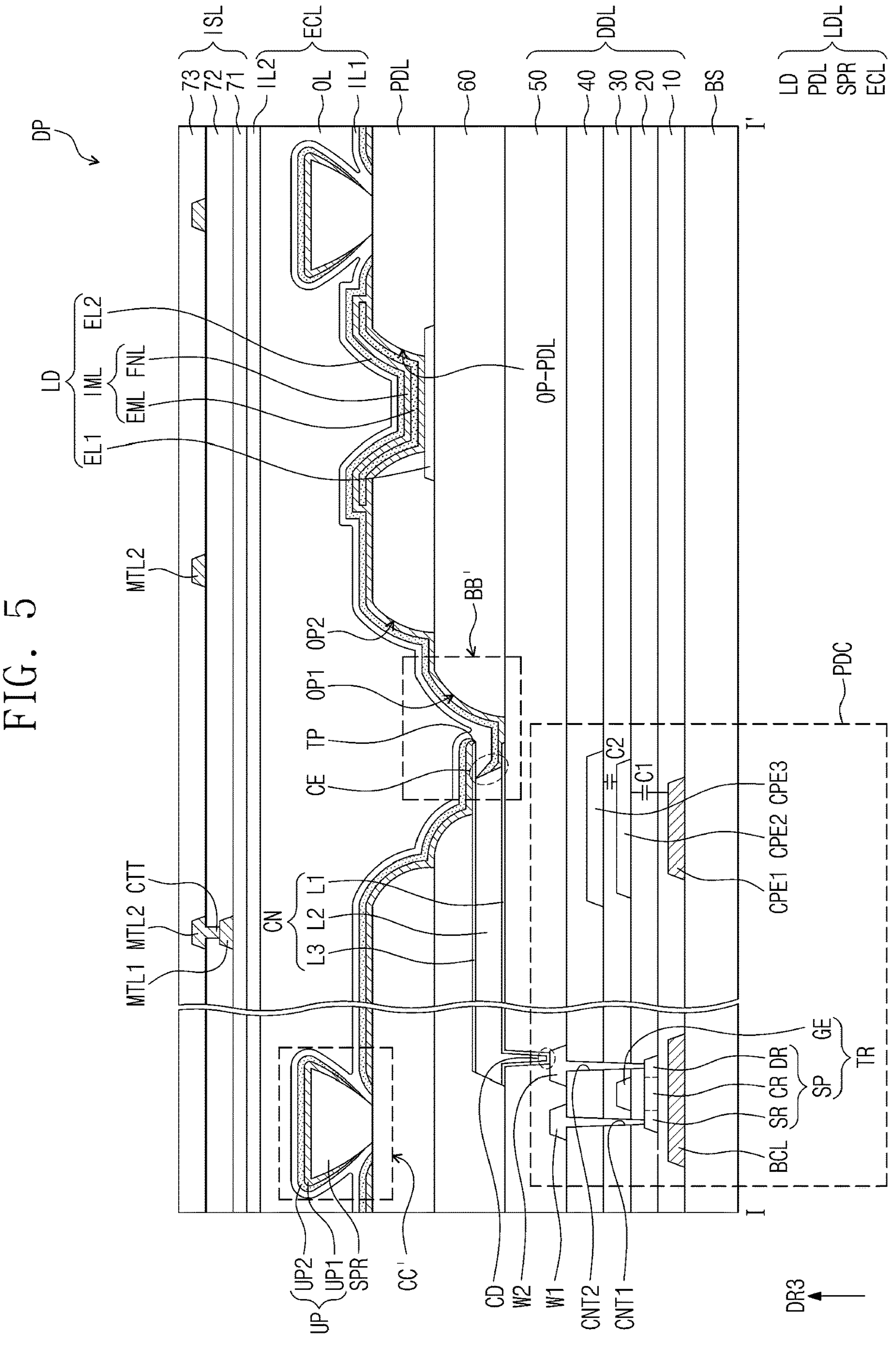
FIG. 5 is a schematic cross-sectional view of a display panel according to an embodiment.
Figure 6A:
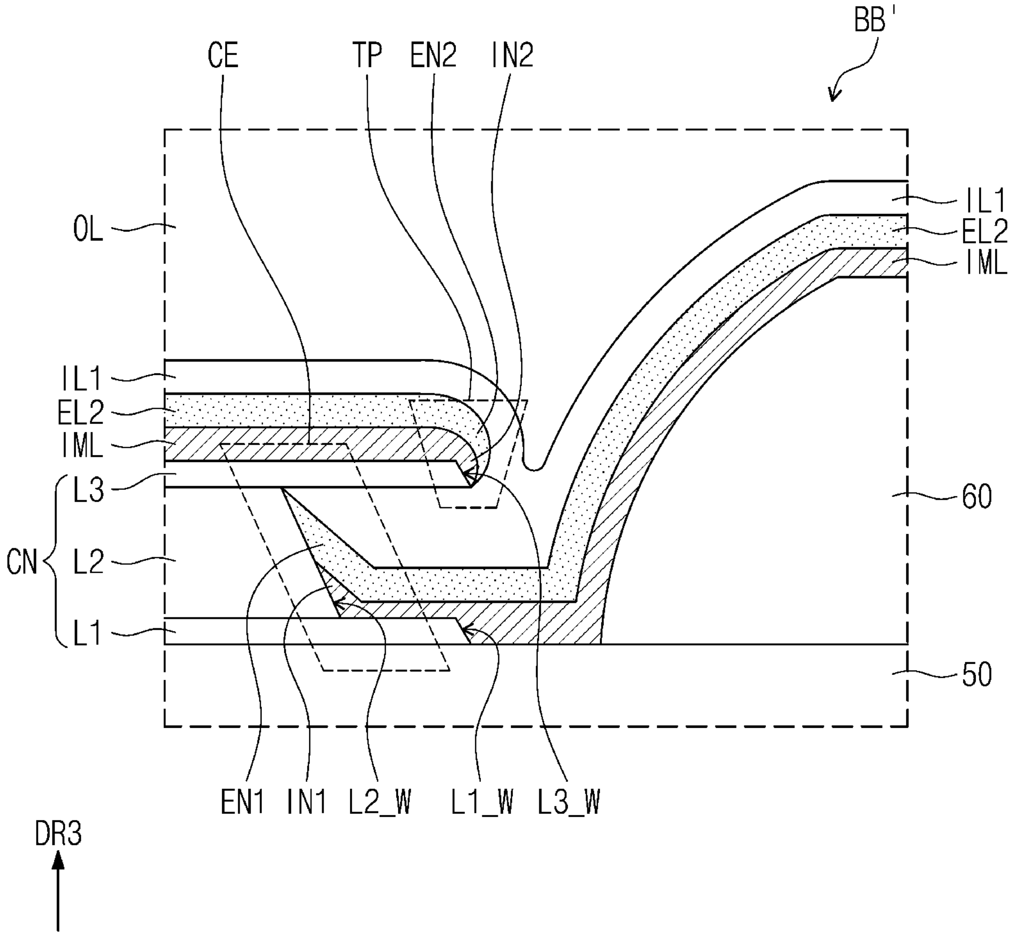
FIG. 6A is a schematic cross-sectional view of some enlarged regions of a display panel according to an embodiment.
Figure 6B:
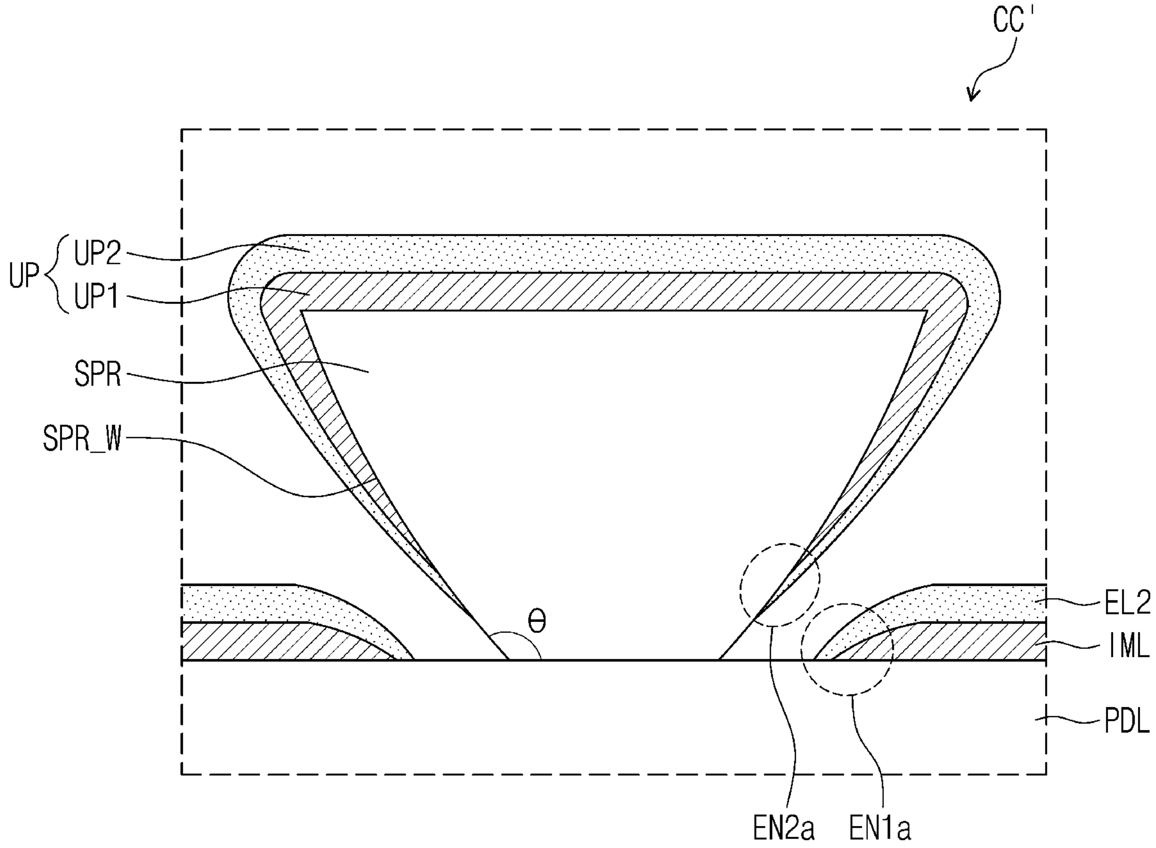
FIG. 6B is a schematic cross-sectional view of some enlarged regions of a display panel according to an embodiment.

FIG. 5 is a schematic cross-sectional view of a display panel according to an embodiment. FIG. 6A is a schematic cross-sectional view of some enlarged regions of a display panel according to an embodiment. FIG. 6B is a schematic cross-sectional view of some enlarged regions of a display panel according to an embodiment.

FIG. 5 illustrates a schematic cross-sectional view showing a portion corresponding to line I-I' of FIG. 4B. Hereinafter, with reference to FIG. 5 to FIG. 6B, an embodiment will be described.

Referring to FIG. 5, the display panel DP of an embodiment may include a base layer BS, a driving device layer DDL, the sixth insulation layer 60, a light emitting device layer LDL, and a sensor layer ISL. The driving device layer DDL may include insulation layers 10, 20, 30, 40, and 50 disposed on the base layer BS, and conductive pattern layers and semiconductor pattern layers disposed between the insulation layers. The conductive pattern layers and the semiconductor pattern layers may be disposed between the insulation layers and form the pixel driver PDC and the connection wiring CN. In FIG. 5, for convenience of description, a cross-section of a region of among regions in which an emitting part is disposed.

The base layer BS may be a member which provides a base surface on which the pixel driver PDC is disposed. The base layer BS may be a rigid substrate, or a flexible substrate capable of bending, folding, rolling, and the like. The base layer BS may be a glass substrate, a metal substrate, a polymer substrate, or the like. However, embodiments are not limited thereto, and the base layer BS may be an inorganic layer, an organic layer, or a composite material layer.

The base layer BS may have a multi-layered structure/member. The base layer BS may include a first polymer resin layer, a silicon oxide($SiO_x$) layer disposed on the first polymer resin layer, an amorphous silicon(a-Si) layer disposed on the silicon oxide layer, and a second polymer resin layer disposed on the amorphous silicon layer. The silicon oxide layer and the amorphous silicon layer may be referred to as a base barrier layer.

The polymer resin layer may include a polyimide-based resin. For example, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In the description, "~~-based" resin means that a functional group of "~~" is included.

Each of insulation layers, conductive layers, and semiconductor layers disposed on the base layer BS of the display panel DP may be formed by coating, deposition, or the like. Thereafter, an organic layer, an inorganic layer, a semiconductor layer, and a conductive layer may be selectively patterned through performing a photolithography process a plurality of times to form a hole in the insulation layer, or to form a semiconductor pattern layer, a conductive pattern layer, a signal line, and the like.

The driving device layer DDL may include first to fifth insulation layers 10, 20, 30, 40, and 50 and the pixel driver PDC sequentially laminated on the base layer BS. FIG. 5 illustrates one transistor TR and two capacitors C1 and C2 in the pixel driver PDC. The transistor TR may correspond to a transistor connected to the light emitting device LD through a connection wiring CN, e.g., a connection transistor connected to a node (e.g., the fourth node N4 of FIG. 2A, or the second node N2 of FIG. 2B) corresponding to the cathode of the light emitting device LD, and e.g., may correspond to the sixth transistor T6 of FIG. 2A or the first transistor T1 of FIG. 2B. For example, other transistors of the pixel driver PDC may have a structure, which is the same as the structure of the transistor TR (hereinafter, a connection transistor) illustrated in FIG. 5. However, this is described as an example, and the other transistors of the pixel driver PDC may have a structure, which is different from the structure of the transistor TR, but embodiments are not limited thereto.

The first insulation layer 10 may be disposed on the base layer BS. The first insulation layer 10 may be an inorganic layer and/or an organic layer, and may have a single-layered structure or a multi-layered structure. The first insulation layer 10 may include at least one of an aluminum oxide, a titanium oxide, a silicon oxide, a silicon nitride, a silicon oxynitride, a zirconium oxide, or a hafnium oxide. In an embodiment, the first insulation layer 10 is illustrated as a single-layered silicon oxide layer. For example, insulation layers to be described below may be inorganic layers and/or organic layers, and may have a single-layered structure or a multi-layered structure. The inorganic layer may include at least one of the above-described materials, but embodiments are not limited thereto.

For example, the first insulation layer 10 may cover a bottom conductive layer BCL. For example, the display panel DP may further include the bottom conductive layer BCL overlapping the connection transistor TR in a lower portion of the connection transistor TR. The bottom conductive layer BCL may block an electric potential due to polarization of the base layer BS from affecting the connection transistor TR. For example, the bottom conductive layer BCL may block light incident to the connection transistor TR from a lower portion of the bottom conductive layer BCL. Between the bottom conductive layer BCL and the base layer BS, at least one of an inorganic barrier layer and a buffer layer may be further disposed.

The bottom conductive layer BCL may include a reflective metal. For example, the bottom conductive layer BCL may include titanium (Ti), molybdenum (Mo), an alloy containing molybdenum, aluminum (Al), an alloy containing aluminum, an aluminum nitride (AlN), tungsten (W), a tungsten nitride (WN), copper (Cu), or the like.

In an embodiment, the bottom conductive layer BCL may be connected to a source of the transistor TR through a source electrode pattern layer W1. For example, the electric potential/voltage of the bottom conductive layer BCL may be synchronized with the electric potential/voltage of the source of the transistor TR. However, this is illustrated as an example, and the bottom conductive layer BCL may be connected to a gate of the transistor TR, thereby being synchronized with the electric potential/voltage of the gate.

In another example, the bottom conductive layer BCL may be connected to another electrode and be independently applied with a constant voltage or a pulse signal. The bottom conductive layer BCL may be provided in an isolated form from another conductive pattern layer. For example, the source electrode pattern layer W1 and the like may be omitted. The bottom conductive layer BCL according to an embodiment may be provided in various embodiments, but embodiments are not limited thereto.

The connection transistor TR may be disposed on the first insulation layer 10. The connection transistor TR may include a semiconductor pattern layer SP and a gate electrode GE. The semiconductor pattern layer SP may be disposed on the first insulation layer 10. The semiconductor pattern layer SP may include an oxide semiconductor. For example, the oxide semiconductor may include a transparent conductive oxide (TCO) such as an indium tin oxide (ITO), an indium zinc oxide (IZO), an indium gallium zinc oxide (IGZO), a zinc oxide (ZnO), an indium oxide ($In_2O_3$), or the like. However, embodiments are not limited thereto, and the semiconductor pattern layer may include amorphous silicon, or polycrystalline silicon (e.g., low-temperature polycrystalline silicon).

The second insulation layer 20 may overlap (e.g., commonly overlap) pixels, and may cover the semiconductor pattern layer SP. The second insulation layer 20 may be an inorganic layer and/or an organic layer, and may have a single-layered structure or a multi-layered structure. The second insulation layer 20 may include at least one of an aluminum oxide, a titanium oxide, a silicon oxide, a silicon nitride, a silicon oxynitride, a zirconium oxide, and a hafnium oxide. In an embodiment, the second insulation layer 20 may be a single-layered silicon oxide layer.

The semiconductor pattern layer SP may include the source region SR, a drain region DR, and an active region CR (or a channel region) which are divided according to the degree of conductivity. The channel region CR may be a portion overlapping the gate electrode GE on a plane (or in a plan view). The source region SR and the drain region DR may be portions spaced apart from each other with the channel region CR interposed therebetween. In case that the semiconductor pattern layer SP is an oxide semiconductor, the source region SR and the drain region DR may each be a reduced region. Accordingly, the source region SR and the drain region DR may have a relatively high reduced metal content ratio compared to that of the active region CR. In another example, in case that the semiconductor pattern layer SP is polycrystalline silicon, the source region SR and the drain region DR may each be a region doped to a high concentration.

The source region SR and the drain region DR may have relatively high conductivity compared to that of the channel region CR. The source region SR may correspond to a source electrode of the connection transistor TR, and the drain region DR may correspond to a drain electrode of the connection transistor TR. As illustrated in FIG. 5, in the connection transistor TR, a separate source electrode pattern layer W1 and a separate drain electrode pattern layer W2 respectively connected to the source region SR and the drain region DR may be further provided. For example, the separate source electrode pattern layer W1 and the separate drain electrode pattern layer W2 may each be formed as a single body with one of lines of the pixel driver PDC, and embodiments are not limited thereto.

The gate electrode GE may be disposed on the second insulation layer 20. The gate electrode GE may correspond to the gate of the connection transistor TR.

The gate electrode GE may be disposed on the semiconductor pattern layer SP. However, this is illustrated as an example. The gate electrode GE may be disposed on a lower side of the semiconductor pattern layer SP, but embodiments are not limited thereto.

The gate electrode GE may include titanium (Ti), silver (Ag), molybdenum (Mo), aluminum (Al), an aluminum nitride, tungsten (W), a tungsten nitride (WN), copper (Cu), an alloy thereof, or the like, but embodiments are not limited thereto.

A first capacitor electrode CPE1 and a second capacitor electrode CPE2 among conductive pattern layers W1, W2, CPE1, CPE2, and CPE3 may form a first capacitor C1. The first capacitor electrode CPE1 and the second capacitor electrode CPE2 may be spaced apart from each other with the first insulation layer 10 and the second insulation layer 20 interposed therebetween.

In an embodiment, the first capacitor electrode CPE1 and the bottom conductive layer BCL may have a shape of a single body. For example, the second capacitor electrode CPE2 and the gate electrode GE may have a shape of a single body.

On the third insulation layer 30, a third capacitor electrode CPE3 may be disposed. The third capacitor electrode CPE3 may be spaced apart from the second capacitor electrode CPE2 with the third insulation layer 30 interposed therebetween, and may overlap the same. The third capacitor electrode CPE3 and the second capacitor electrode CPE2 may form a second capacitor C2.

On the third capacitor electrode CPE3, the fourth insulation layer 40 may be disposed.

On the fourth insulation layer 40, a source electrode pattern layer W1 and a drain electrode pattern layer W2 may be disposed. The source electrode pattern layer W1 may be connected to a source region SR of the connection transistor TR through a first contact-hole CNT1, and the source electrode pattern layer W1 and the source region SR of the semiconductor pattern layer SP may function as a source of the connection transistor TR. The drain electrode pattern layer W2 may be connected to a drain region DR of the connection transistor TR through a second contact-hole CNT2, and the drain electrode pattern layer W2 and the drain region DR of the semiconductor pattern layer SP may function as a drain of the connection transistor TR.

On the source electrode pattern layer W1 and the drain electrode pattern layer W2, the fifth insulation layer 50 may be disposed.

On the fifth insulation layer 50, the connection wiring CN may be disposed. The connection wiring CN may connect the connection transistor TR and the light emitting device LD. The connection wiring CN may be a connection node for connecting the pixel driver PDC and the light emitting device LD. For example, the connection wiring CN may correspond to the fourth node N4 illustrated in FIG. 2A, or may correspond to the second node N2 illustrated in FIG. 2B. For example, this is described as an example, and as long as the connection wiring CN is connected to the light emitting device LD, the connection wiring CN may be defined as a connection node with various elements among elements of the pixel driver PDC according to a design of the pixel driver PDC, but embodiments are not limited thereto.

For example, the sixth insulation layer 60 may be disposed between the driving device layer DDL and the light emitting device layer LDL. The sixth insulation layer 60 may be disposed on the fifth insulation layer 50 and may cover the connection wiring CN. The fifth insulation layer 50 and the sixth insulation layer 60 may each be an organic layer. For example, the fifth insulation layer 50 and the sixth insulation layer 60 may each include a general purpose polymer, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, a blend thereof, or the like. The material of the fifth insulation layer 50 and the sixth insulation layer 60 is not limited to the above examples, and the fifth insulation layer 50 and the sixth insulation layer 60 may include BCB (Benzocyclobutene) or HMDSO (Hexamethyldisiloxane).

The sixth insulation layer 60 may be provided with a through-hole which exposes at least a portion of the connection wiring CN. The connection wiring CN may be electrically connected to the light emitting device LD of the light emitting device layer LDL through the portion exposed from the sixth insulation layer 60. For example, the connection wiring CN connects the connection transistor TR and the light emitting device LD. A detailed description thereof will be described below.

On the sixth insulation layer 60, the light emitting device layer LDL may be disposed. The light emitting device layer LDL may include a pixel definition film PDL, a light emitting device LD, an encapsulation layer ECL, and a separator SPR. For example, in the display panel DP according to an embodiment, the sixth insulation layer 60 may be omitted, or be provided in plurality, but embodiments are not limited thereto.

The pixel definition film PDL may be an organic layer. For example, the pixel definition film PDL may include a general purpose polymer, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, a blend thereof, or the like. The material of the pixel definition film PDL is not limited to the above examples, and the pixel definition film PDL may include BCB (Benzocyclobutene) or HMDSO (Hexamethyldisiloxane). In an embodiment, the pixel definition film PDL may have properties of absorbing light, and for example, the pixel definition film PDL may have a black color. The pixel definition film PDL may include a black coloring agent. The black coloring agent may include a black dye and a black pigment. The black coloring agent may include carbon black, or a metal such as chromium or an oxide thereof. The pixel definition film PDL may correspond to a light blocking pattern layer having light blocking properties.

In the pixel definition film PDL, the opening OP-PDL (hereinafter, a light emitting opening) passing therethrough may be defined. The light emitting opening OP-PDL may be provided in plurality and be disposed to correspond to each light emitting device LD. The light emitting opening OP-PDL may be a region in which all constituent elements of the light emitting device LD overlap, and may be substantially a region in which light emitted by the light emitting device LD is displayed. Accordingly, the shape of the above-described emitting part EP (see FIG. 3A) may substantially correspond to the shape of the light emitting opening OP-PDL on a plane (or in a plan view).

The light emitting device LD may include an organic light emission material, an inorganic light emission material, an organic-inorganic light emission material, a quantum dot, a quantum rod, a micro-LED, or a nano-LED.

The light emitting device LD may include the first electrode EL1, an intermediate layer IML, and the second electrode EL2. The first electrode EL1 may be a transflective, transmissive, or reflective electrode. According to an embodiment, the first electrode EL1 may include a reflective layer formed of silver (Ag), magnesium (Mg), aluminum (Al), platinum (Pt), palladium (Pd), gold (Au), nickel (Ni), neodymium (Nd), iridium (Jr), chromium (Cr), a compound thereof, or the like, and a transparent or translucent electrode layer formed on the reflective layer. The transparent or translucent electrode layer may be provided with at least one selected from the group consisting of an indium tin oxide (ITO), an indium zinc oxide (IZO), an indium gallium zinc oxide (IGZO), a zinc oxide (ZnO), an indium oxide ($In_2O_3$), and an aluminum-doped zinc oxide (AZO). For example, the first electrode EL1 may include a laminated structure of ITO/Ag/ITO.

In an embodiment, the first electrode EL1 may be the anode of the light emitting device LD. For example, the first electrode EL1 may be connected to the first power line VDL (see FIG. 2A) and may receive the first power supply voltage VDD (see FIG. 2A). The first electrode EL1 may be connected to the first power line VDL in the display region DA, or may be connected to the first power line VDL in the peripheral region NDA. In the latter case, the first power line VDL may be disposed in the peripheral region NDA, and the first electrode EL1 may have a shape extending to the peripheral region NDA.

In an embodiment, the first electrode EL1 is illustrated as overlapping the light emitting opening OP-PDL and as not overlapping the separator SPR, but embodiments are not limited thereto. As described above, the first electrode of each pixel may have a shape of a single body, and as illustrated in FIG. 4C, may have a mesh shape or a lattice shape in which openings OP-EL1 are defined in some regions. For example, as long as the same first power supply voltage VDD is applied to the first electrode EL1 of each of light emitting devices LD, the shape of the first electrode EL1 may be provided in various ways, but embodiments are not limited thereto.

The intermediate layer IML may be disposed between the first electrode EL1 and the second electrode EL2. The intermediate layer IML may include an emitting layer EML and a functional layer FNL. However, this is illustrated as an example, and the light emitting device LD may include the intermediate layer IML of various structures, but embodiments are not limited thereto. For example, the functional layer FNL may be provided as a plurality of layers, or may be provided as two or more layers spaced apart from each other with the emitting layer EML interposed therebetween. In another example, in an embodiment, the functional layer FNL may be omitted.

The emitting layer EML may emit light by absorbing energy corresponding to a potential difference between the first electrode EL1 and the second electrode EL2. Although the emitting layer EML is illustrated as an embodiment including an organic light emitting material, embodiments are not limited thereto, and the emitting layer EML may include an inorganic light emitting material or may be provided as a mixed layer of an organic light emitting material and an inorganic light emitting material.

The emitting layer EML may be disposed to overlap the light emitting opening OP-PDL. In an embodiment, the emitting layer EML may be divided and formed in each pixel. In case that the emitting layer EML is divided and formed in each of the emitting parts EP, the emitting layer EML may emit light of at least any one color of blue, red, and green. However, embodiments are not limited thereto, and the emitting layer EML may have a shape of a single body commonly provided to adjacent emitting parts EP. For example, the emitting layer EML may provide/emit blue light, or may provide/emit white light. For example, the emitting layer EML may have the same shape as that of the functional layer FNL, and may be provided as the intermediate layer IML having a shape of a single body without limitation on a layer boundary with the functional layer FNL.

The functional layer FNL may be disposed between the first electrode EL1 and the second electrode EL2. For example, the functional layer FNL may be disposed between the first electrode EL1 and the emitting layer EML, or be disposed between the second electrode EL2 and the emitting layer EML. In another example, the functional layer FNL may be disposed between the first electrode EL1 and the emitting layer EML and between the second electrode EL2 and the emitting layer EML. In an embodiment, the emitting layer EML is illustrated as being inserted into the functional layer FNL. However, this is illustrated as an example, and the functional layer FNL may include a layer disposed between the emitting layer EML and the first electrode EL1, and/or a layer disposed between the emitting layer EML and the second electrode EL2, and may be provided in plurality, but embodiments are not limited thereto.

The functional layer FNL may control the movement of charges. The functional layer FNL may include a hole injection/transport material and/or an electron injection/transport material. The functional layer FNL may include at least one of an electron blocking layer, a hole transport layer, a hole injection layer, a hole blocking layer, an electron transport layer, an electron injection layer, and a charge generation layer.

The second electrode EL2 may be one of the second electrodes EL2_1, EL2_2, and EL2_3 illustrated in FIG. 4B. For example, the second electrode EL2 may be the second electrode EL2_1 (see FIG. 4B). The second electrode EL2 may be disposed on the intermediate layer IML. As described above, the second electrode EL2 may be connected to the pixel driver PDC through the node (e.g., the fourth node N4 of FIG. 2A or the second node N2 of FIG. 2B). In an embodiment, the second electrode EL2 may be electrically connected to the connection transistor TR through the connection wiring CN.

As described above, the connection wiring CN may include a driver connection part CD and an emission connection part CE. In FIG. 6A and FIG. 6B, region BB' and region CC' of FIG. 5 are enlarged and illustrated. Hereinafter, the connection wiring CN will be described with reference to FIG. 5 to FIG. 6B.

The driver connection part CD may be a portion of the connection wiring CN that is connected to the pixel driver PDC, and may be a portion substantially connected to the connection transistor TR. In an embodiment, the driver connection part CD may pass through the fifth insulation layer 50 and may be connected to the drain region DR of the semiconductor pattern layer SP through the drain electrode pattern layer W2 of the transistor TR.

The emission connection part CE may be a portion of the connection wiring CN that is connected to the light emitting device LD. The emission connection part CE may be defined in a region exposed from the sixth insulation layer 60, and may be a portion to which the second electrode EL2 is connected (e.g., directly connected). For example, a tip part TP may be defined in the emission connection part CE.

Referring to FIG. 5 and FIG. 6A, the connection wiring CN may have a three-layered structure. For example, the connection wiring CN may include a first layer L1, a second layer L2, and a third layer L3 which are sequentially laminated along a third direction DR3. The first layer L1 may be relatively thinner than the second layer L2. For example, the first layer L1 may include titanium (Ti).

The second layer L2 may include a material different from that of the first layer L1. The second layer L2 may include a highly conductive material. For example, the second layer L2 may include aluminum (Al).

For example, the second layer L2 may include a material having a higher etch selection ratio than the first layer L1. A side surface L2_W of the second layer L2 may be defined further inside than a side surface L1_W of the first layer L1. For example, the side surface L1_W of the first layer L1 may protrude outward from the side surface L2_W of the second layer L2.

The third layer L3 may include a material different from that of the second layer L2. The third layer L3 may include a material having a lower etch selection ratio than the second layer L2. For example, the third layer L3 may include titanium (Ti). A side surface L3_W of the third layer L3 may protrude outward from the side surface L2_W of the second layer L2. For example, the side surface L2_W of the second layer L2 may be disposed (or recessed) more inside than the side surface L3_W of the third layer L3 to have an undercut shape or an overhang structure. The tip part TP of the emission connection part CE may be defined by a portion of the third layer L3 further protruding than the second layer L2.

The sixth insulation layer 60 and the pixel definition film PDL may expose the tip part TP. For example, a first opening OP1 for exposing a side of the connection wiring CN in which the tip part TP is defined may be defined in the sixth insulation layer 60, and a second opening OP2 overlapping the first opening OP1 may be defined on the pixel definition film PDL. A planar area (or diameter) of the second opening OP2 may be at least the same as that of the first opening OP1, or may be greater than that of the first opening OP1.

The second electrode EL2 may also be formed on some regions of the sixth insulation layer 60 exposed by the second opening OP2. The second electrode EL2 may also be formed on an upper surface of the sixth insulation layer 60 and an upper surface of the tip part TP of the connection wiring CN exposed by the first opening OP1. For example, the second electrode EL2 may include an end portion EN1 formed along the upper surface of the sixth insulation layer 60 and another end portion EN2 formed on the upper surface of the tip part TP. The end portion EN1 and the another end portion EN2 may be separated from each other in a region in which the emission connection part CE is defined. For example, the second electrode EL2 may be disconnected by the tip part TP, and accordingly, the end portion EN1 and the another end portion EN2 spaced apart from each other may be formed. The end portion EN1 may be formed along the side surface L2_W of the second layer L2 and may come in contact with the side surface L2_W of the second layer L2, and may be disposed on a lower side of the third layer L3. The another end portion EN2 may be disconnected from an end portion of the third layer L3 and may not extend to the lower side of the third layer L3. For example, in an embodiment, the another end portion EN2 is illustrated as covering the side surface L3_W of the third layer L3, but this is illustrated as an example, and at least a portion of the side surface L3_W of the third layer L3 may be exposed from the another end portion EN2. According to an embodiment, the tip part TP formed on the connection wiring CN may cut the second electrode EL2 into two portions. One of the two cut portions may come in contact with the second layer L2 having a relatively high conductivity, and thus, may be electrically connected to the emission connection part CE of the connection wiring CN.

For example, the intermediate layer IML may also be cut into two portions IN1 and IN2 with respect to the tip part TP. The intermediate layer IML may include an end portion IN1 formed along the upper surface of the sixth insulation layer 60 and another end portion IN2 formed on the upper surface of the tip part TP. The end portion IN1 and the another end portion IN2 of the intermediate layer IML may be separated from each other in a region in which the emission connection part CE is defined.

Among disconnected portions of the intermediate layer IML, the end portion IN1 disposed on the side of an end portion EN1 of the second electrode EL2 may cover the first layer L1 and be contact with the second layer L2, and the end portion IN2 disposed on the side of the another end portion EN2 of the second electrode EL2 may be formed on the another end portion EN2 of the second electrode EL2. For example, the end portion EN1 of the second electrode EL2 may have a relatively larger contact area with respect to the side surface L2_W of the second layer L2 than the end portion IN1 of the intermediate layer IML disposed on the same side. A portion of the side surface L2_W of the second layer L2 that is not covered by the intermediate layer IML may all be covered by the second electrode EL2. This may reduce an area as much as possible in which the intermediate layer IML is in contact with the side surface L2_W of the second layer L2 with being disconnected by the tip part TP through a difference in deposition angle to be described below, and may increase an area as much as possible in which the second electrode EL2 is in contact with the side surface L2_W of the second layer L2. Therefore, in the emission connection part CE, the degree of intervention of the intermediate layer IML may be reduced or minimized, and the connection between the second electrode EL2 and the second layer L2 may be facilitated/implemented. Therefore, the second electrode EL2 may be stably connected to the connection wiring CN with being separated for each pixel without a separate patterning process.

For example, the display panel DP may include the separator SPR. The separator SPR may be disposed on the pixel definition film PDL. The second electrode EL2 and the intermediate layer IML may be commonly formed in the pixels by using an open mask. For example, the second electrode EL2 and the intermediate layer IML may be partitioned by the separator SPR. As described above, the separator SPR may have a closed-line shape for each emitting part so as to be independent of each emitting part, and accordingly, the second electrode EL2 may have a shape divided for each emitting part. For example, the second electrode EL2 may be electrically independent of each adjacent pixel.

Referring to FIG. 5 and FIG. 6B, the separator SPR will be described in more detail. FIG. 6B is a schematic cross-sectional view of an enlarged separator SPR. The separator SPR may have a reverse tapered shape. For example, an inner angle θ (hereinafter, a taper angle) formed by an outer surface SPR_W of the separator SPR with respect to the upper surface the pixel definition film PDL may be an obtuse angle. However, this is illustrated as an example, and as long as the separator SPR disconnects a laminated layer such as the intermediate layer IML and the second electrode EL2, the taper angle θ may be set in various ways, and the separator SPR may have the same structure as that of the tip part TP, but embodiments are not limited thereto.

The separator SPR may have insulation properties by including an organic material. The separator SPR may include a multi-layered member including at least one of an organic material, a metal, and a transparent electrode. By the separator SPR, the laminated layer, e.g., the intermediate layer IML, and the second electrode EL2 may be disconnected from each other. The intermediate layer IML and the second electrode EL2 may be partitioned or separated by the separator SPR from an intermediate layer IML and a second electrode EL2 included in an adjacent light emitting device. A first end portion EN1*a* and a second end portion EN2*a* may be formed on the laminated layer by the separator SPR. The first end portion EN1*a* may be spaced apart from the separator SPR and be positioned on the pixel definition film PDL. The second end portion EN2*a* may be separated from the first end portion EN1*a* and cover at least a portion of the outer surface SPR_W of the separator SPR. In FIG. 6B, the first end portion EN1*a* is illustrated as being spaced apart at a certain interval (or distance) from the outer surface SPR_W of the separator SPR, but embodiments are not limited thereto, and in case that separated from the second end portion EN2*a*, the first end portion EN1*a* may also contact the outer surface SPR_W of the separator SPR.

For example, the first end portion EN1*a* and the second end portion EN2*a* may mean an electrical disconnection. For example, in case that the first end portion EN1*a* and the second end portion EN2*a* are physically connected to each other without being formed on the laminated layer, in case that the second end portion EN2*a* formed along the outer surface SPR_W of the separator SPR is formed to be thin so that a portion formed in the separator SPR and an adjacent portion may be electrically insulated from each other, the laminated layer may be considered to be partitioned/separated by the separator SPR.

In an upper portion of the separator SPR, a dummy layer UP may be disposed. The dummy layer UP may include a first dummy layer UP1 disposed on the separator SPR and a second dummy layer UP2 disposed on the first dummy layer UP1. The first dummy layer UP1 and the intermediate layer IML may be formed by the same process, and the second dummy layer UP2 and the second electrode EL2 may be formed by the same process. For example, the first dummy layer UP1 and the second dummy layer UP2 may be formed in case that the intermediate layer IML and the second electrode EL2 are formed. In an embodiment, the dummy layer UP may be omitted.

According to an embodiment, in case that there is no separate patterning process through a mask, by preventing the second electrode EL2 or the intermediate layer IML from being formed on the outer surface SPR_W of the separator SPR or by forming to be the same thin in case that the second electrode EL2 and the intermediate layer IML are formed, it is possible to allow the second electrode EL2 or the intermediate layer IML to be partitioned for each pixel. However, this is illustrated as an example, and as long as the second electrode EL2 and the intermediate layer IML are disconnected, the shape of the separator SPR may be changed in various ways, but embodiments are not limited thereto.

According to an embodiment, the display panel DP may include the connection wiring CN, so that the electrical connection between the second electrode EL2 and the connection transistor TR may be facilitated/implemented. For example, according to an embodiment, by forming the tip part TP in the connection wiring CN, it is possible to readily partition the second electrode EL2 for each emitting part without a separate patterning process. For example, through the control of a deposition angle, it is possible to readily implement the electrical connection between the second electrode EL2 and the connection wiring CN. Therefore, even though the second electrode EL2 connected to the pixel driver PDC is disposed above the first electrode EL1, the display panel DP in which the second electrode EL2 may be stably connected to the pixel driver PDC may be readily implemented.

Referring back to FIG. 5, the encapsulation layer ECL may be disposed on the pixel definition film PDL to cover the separator SPR. The encapsulation layer ECL may include a first inorganic layer ILL an organic layer OL, and a second inorganic layer IL2 which are sequentially laminated. However, embodiments are not limited thereto, and the encapsulation layer ECL may further include inorganic layers and organic layers.

The first and the second inorganic layers IL1 and IL2 may protect the light emitting device layer LDL from moisture and oxygen, and the organic layer OL may protect the light emitting device layer LDL from foreign materials such as dust particles. The first and second inorganic layers IL1 and IL2 may include a silicon nitride layer, a silicon oxynitride layer, a silicon oxide layer, a titanium oxide layer, an aluminum oxide layer, or the like. The organic layer OL may include an acrylic organic layer, but embodiments are not limited thereto.

The sensing layer ISL may sense an external input. In an embodiment, the sensing layer ISL may be formed on the light emitting device layer LDL by a continuous process. For example, the sensing layer ISL may be expressed as being disposed (e.g., directly disposed) on the light emitting device layer LDL. Being directly disposed may mean that there are no other components disposed between the sensing layer ISL and the light emitting device layer LDL. For example, a separate adhesive member may not be disposed between the sensing layer ISL and the light emitting device layer LDL. However, this is illustrated as an example, and in the display panel DP according to an embodiment, the sensing layer ISL may be separately formed and provided, and may be coupled to the light emitting device layer LDL through an adhesive member, but embodiments are not limited thereto.

The sensing layer ISL may include conductive layers MTL1 and MTL2 and insulation layers 71, 72 and 73. The insulation layers 71, 72, and 73 may include first to third sensing insulation layers 71, 72, and 73. However, this is illustrated as an example, and the number of insulation layers forming the insulation layers 71, 72, and 73 are not limited to any one embodiment.

The first sensing insulation layer 71 may be an inorganic layer including at least one of a silicon nitride, a silicon oxynitride, and a silicon oxide. In another example, the first sensing insulation layer 71 may be an organic layer including an epoxy resin, an acrylic resin, or an imide-based resin. The first sensing insulation layer 71 may have a single-layered structure, or a multi-layered structure in which layers are laminated along the third direction DR3.

The conductive layers MTL1 and MTL2 may include a first conductive layer MTL1 and a second conductive layer MTL2. The first conductive layer MTL1 may be disposed between the first sensing insulation layer 71 and the second sensing insulation layer 72, and the second conductive layer MTL2 may be disposed between the second sensing insulation layer 72 and the third sensing insulation layer 73. A portion of the second conductive layer MTL2 may be connected to the first conductive layer MTL1 through a contact-hole CNT formed on the second sensing insulation layer 72. Each of the conductive layers MTL1 and MTL2 may have a single-layered structure, or a multi-layered structure laminated along the third direction DR3.

A conductive layer of a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium tin zinc oxide (ITZO), or the like. For example, the transparent conductive layer may include a conductive polymer such as poly(3,4-ethylenedioxythiophene) (PEDOT), a metal nanowire, graphene, and the like.

A conductive layer of a multi-layered structure may include metal layers. The metal layers may have, for example, a three-layered structure of titanium/aluminum/titanium. The conductive layer of a multi-layered structure may include at least one metal layer and at least one transparent conductive layer.

The first conductive layer MTL1 and the second conductive layer MTL2 may form a sensor that senses an external input in the sensing layer ISL. The sensor may be driven by a capacitive method and may be driven in either a mutual capacitive method or a self capacitive method. However, this is described as an example, and the sensor may be driven by a resistive film method, an ultrasonic method, or an infrared method in addition to the capacitive method, but embodiments are not limited thereto.

Each of the first conductive layer MTL1 and the second conductive layer MTL2 may include a transparent conductive oxide, or may have a metal mesh shape formed of an opaque conductive material. The first conductive layer MTL1 and the second conductive layer MTL2 may have various materials and various shapes as long as the visibility of an image displayed by light generated by the display panel DP is not degraded, but embodiments are not limited thereto.

The third sensing insulation layer 73 may include an inorganic film. The inorganic film may include at least one of an aluminum oxide, a titanium oxide, a silicon oxide, a silicon nitride, a silicon oxynitride, a zirconium oxide, and a hafnium oxide.

In another example, the third sensing insulation layer 73 may include an organic film. The organic film may include at least any one among an acrylate-based resin, a methacrylate-based resin, polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

According to an embodiment, the display panel DP may include the emission connection part CE and the driver connection part CD spaced apart from each other, so that the position of the light emitting device LD may be designed at various positions without being limited to the configuration of the pixel driver PDC or the position of the connection transistor TR. For example, the degree of freedom in designing the position of the light emitting device LD or designing the pixel driver PDC may be increased. For example, according to an embodiment, the display panel DP may include the connection wiring CN, so that the electrical connection between the second electrode EL2 disposed above the first electrode EL1 functioning as an anode and the pixel driver PDC may be facilitated/implemented. According to an embodiment, by forming a tip part in the connection wiring CN, it is possible to readily disconnect an organic layer such as the intermediate layer IML without a separate patterning process. For example, through the control of a deposition angle, it is possible to readily implement the electrical connection between the second electrode EL2 and the connection wiring CN.

Figure 7:
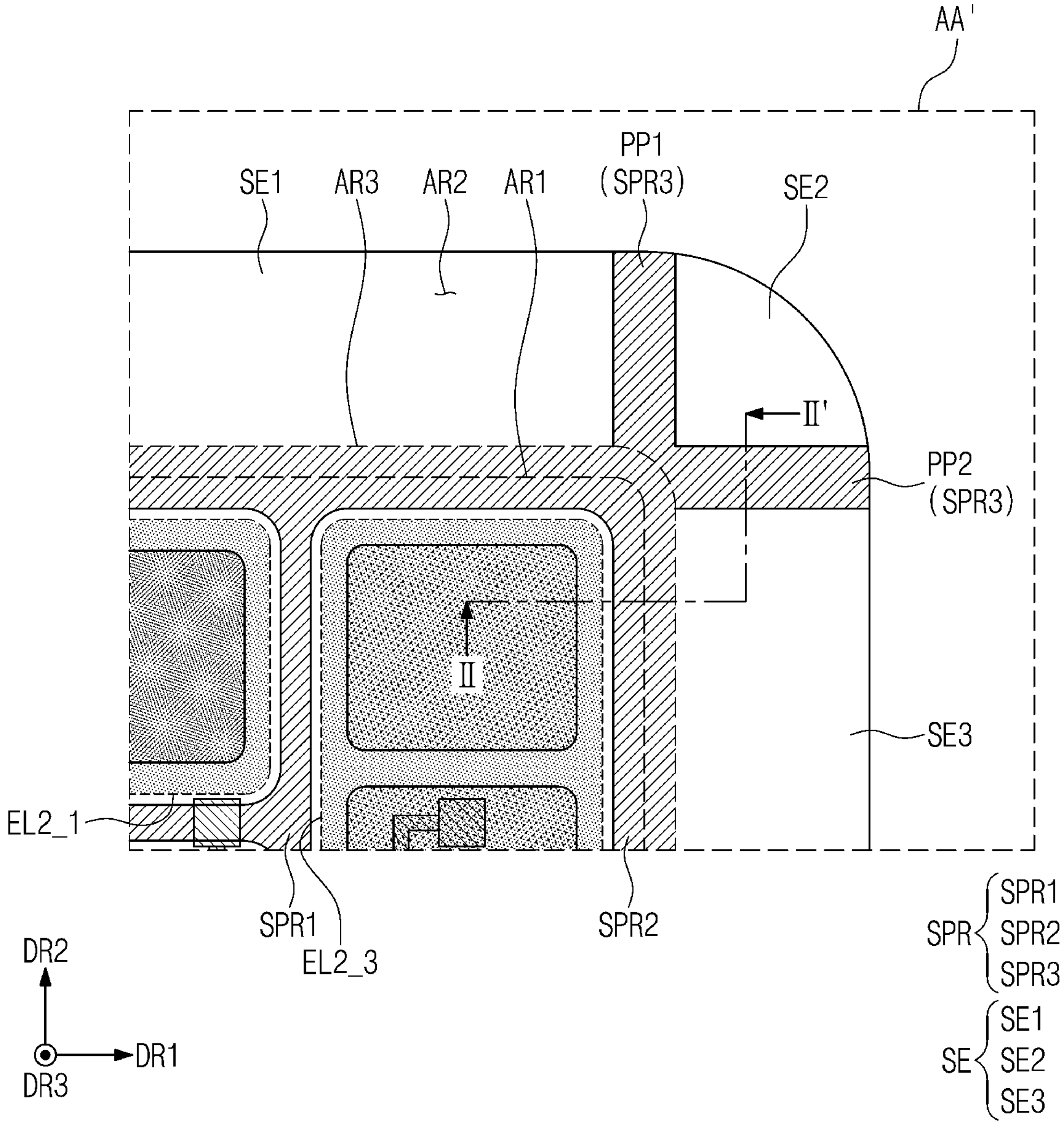
FIG. 7 is a schematic plan view of an enlarged region co to region AA' of FIG. 3A.

FIG. 7 is a schematic plan view of an enlarged region corresponding to region AA' of FIG. 3A.

Referring to FIG. 5 and FIG. 7, the display panel DP may include a first region AR1, a second region AR2, and a third region AR3. The first region AR1 may have light emitting devices LD defined therein, and may be a region corresponding to the display region DA (see FIG. 3A). The second region AR2 may surround the first region AR1, and may be a region corresponding to a portion of the peripheral region NDA (see FIG. 3A), and the third region AR3 may overlap another portion of the peripheral region NDA, and may be a region disposed between the first region AR1 and the second region AR2.

The separator SPR of FIG. 5 may include a pixel boundary portion SPR1, a peripheral boundary portion SPR2, and a peripheral partition portion SPR3.

The pixel boundary portion SPR1 may be disposed in the first region AR1, and may be a portion corresponding to the boundary between the light emitting devices LD. The pixel boundary portion SPR1 may divide the plurality of emitting parts EP1, EP2, and EP3 on a plane (or in a plan view). The pixel boundary portion SPR1 may partition/define the boundary between second electrodes EL2 disposed within the first region AR1. For example, the second electrodes EL2 of the light emitting devices LD may be disposed on the intermediate layer IML, and may be surrounded by the pixel boundary portion SPR1. Therefore, the second electrodes EL2 of the light emitting devices LD may be disconnected from each other by the pixel boundary portion SPR1.

The peripheral boundary portion SPR2 may be disposed in a portion of the first region AR1 and in the third region AR3, and may be a portion corresponding to the boundary between the display region DA and the peripheral region NDA. For example, the second electrodes EL2 disposed in the display region DA and a conductive pattern layer SE disposed in the peripheral region NDA may be separated by the peripheral boundary portion SPR2. For example, the conductive pattern layer SE may be separated from the display region DA with respect to the peripheral boundary portion SPR2. The conductive pattern layer SE and the second electrodes EL2 may include the same material, and may be formed by the same process.

The peripheral partition portion SPR3 may be disposed in the second region AR2, and may partition/define the peripheral region NDA. For example, the peripheral partition portion SPR3 may electrically separate the conductive pattern layer SE disposed in the peripheral region NDA.

Figure 8:
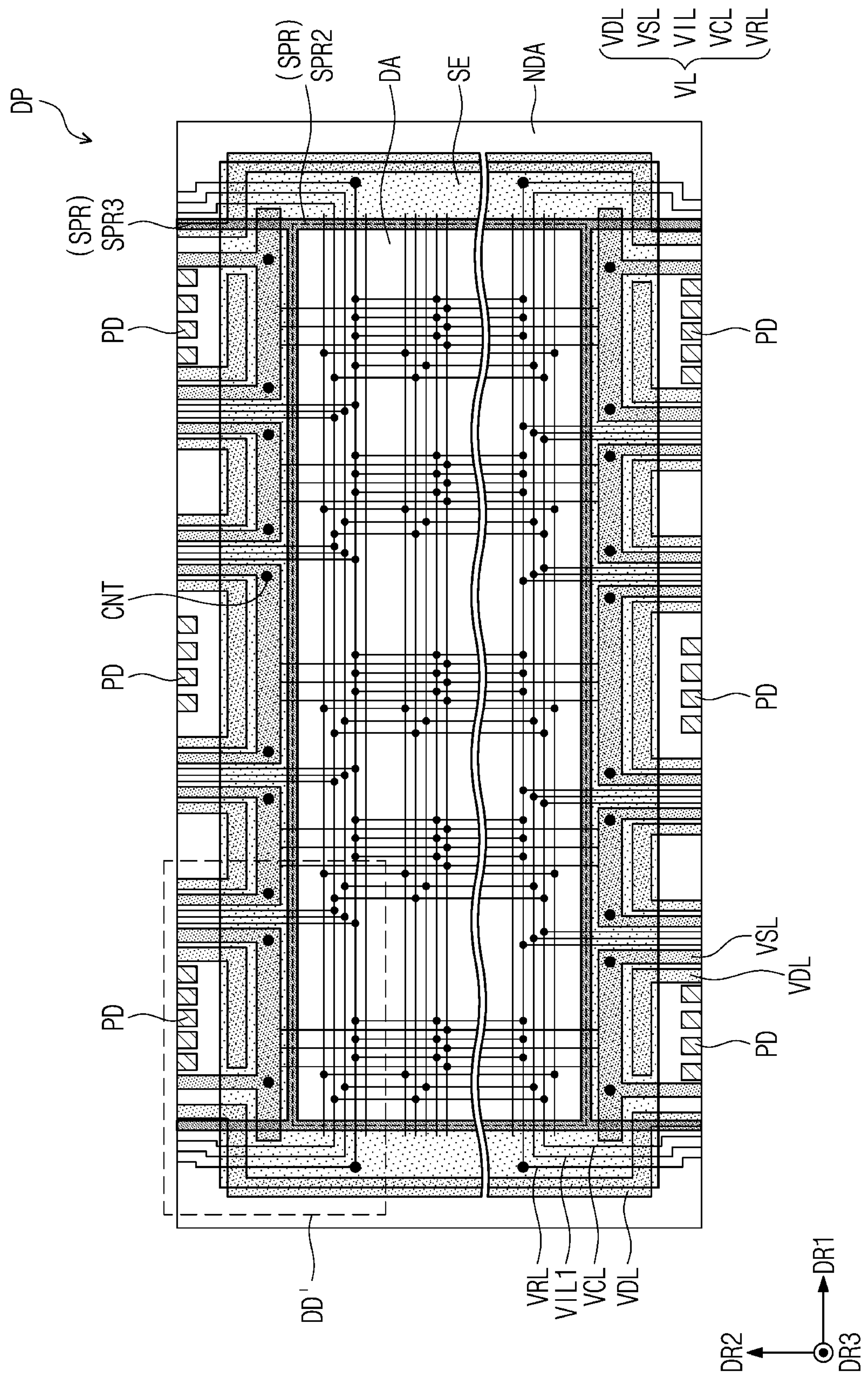
FIG. 8 is a plan view showing a partial configuration of a display panel according to an embodiment.

According to an embodiment, separated conductive pattern layers SE may be connected to at least one of voltage lines VL (see FIG. 8). For example, the conductive pattern layers SE may be in a state of receiving a certain voltage rather than being in an electrically floating state. Therefore, the separated conductive pattern layers SE may be utilized in various ways within the display panel DP, unpredictable operations by the conductive pattern layers SE may be reduced or eliminated, and accordingly, a display panel DP including a highly reliable circuit may be implemented.

The peripheral partition portion SPR3 may include a first peripheral partition portion PP1 and a second peripheral partition portion PP2. The first peripheral partition portion PP1 and the second peripheral partition portion PP2 may be portions protruding and extending from the peripheral boundary portion SPR2. FIG. 7 illustrates two protruding portions.

The first peripheral partition portion PP1 may electrically separate a first conductive pattern layer SE1 and a second conductive pattern layer SE2 among the conductive pattern layers SE, and the second peripheral partition portion PP2 may electrically separate the second conductive pattern layer SE2 and a third conductive pattern layer SE3. For example, the first, second, and third conductive pattern layers SE1, SE2, and SE3 may be electrically separated by the first peripheral partition portion PP1 and the second peripheral partition portion PP2.

FIG. 7 illustrates a shape in which the first peripheral partition portion PP1 and the second peripheral partition portion PP2 protrude and extend from the peripheral boundary portion SPR2, but the shape of the peripheral partition portion SPR3 is not limited thereto. For example, the peripheral partition portion SPR3 may have various shapes such as a lattice shape and a closed curve shape. A detailed description will be given below.

FIG. 8 is a schematic plan view illustrating a portion of the configuration of the display panel DP according to an embodiment. FIG. 8 will be described with reference to FIG. 7, and descriptions of the same reference numerals will be omitted for descriptive convenience.

Referring to FIG. 8, the display panel DP may include the voltage lines VL, the pads PD, the peripheral boundary portion SPR2 of the separator SPR, the second electrodes EL2, and the conductive pattern layers SE.

The voltage lines VL to which various constant voltages required for the display panel DP are provided may pass through the peripheral region NDA. The voltage lines VL may have a mesh structure within the display region DA to provide a voltage to the light emitting devices LD (see FIG. 5) disposed throughout the display panel DP. The voltage lines VL may include the first power line VDL, the second power line VSL, the first initialization voltage line VIL1, the compensation voltage line VCL, and the reference voltage line VRL. The voltage lines VL may be connected to the conductive pattern layers SE through the contact-holes CNT. In FIG. 8, between the first initialization voltage line VIL1 and the second initialization voltage line VIL2 (see FIG. 2A), only the first initialization voltage line VIL1 is illustrated. However, this is an example, and the second initialization voltage line VIL2 may be disposed having a structure similar to that of the first initialization voltage line VIL1.

The pads PD may be disposed adjacent to an end portion of the peripheral region NDA along the first direction DR1. The pads PD may be a portion electrically connected to a circuit board. Each of the pads PD may be connected to a corresponding data line among the data lines DL1 to DLm (see FIG. 1). The circuit board may be electrically connected to the display panel DP to provide a signal for driving the display panel DP. For example, the data driver DDC (see FIG. 1) and the timing control TC (see FIG. 1) may be mounted on the circuit board, and the scan driver SDC (see FIG. 1) may be included in the display panel DP. The circuit board may control the operation of the scan driver SDC.

Figure 9:
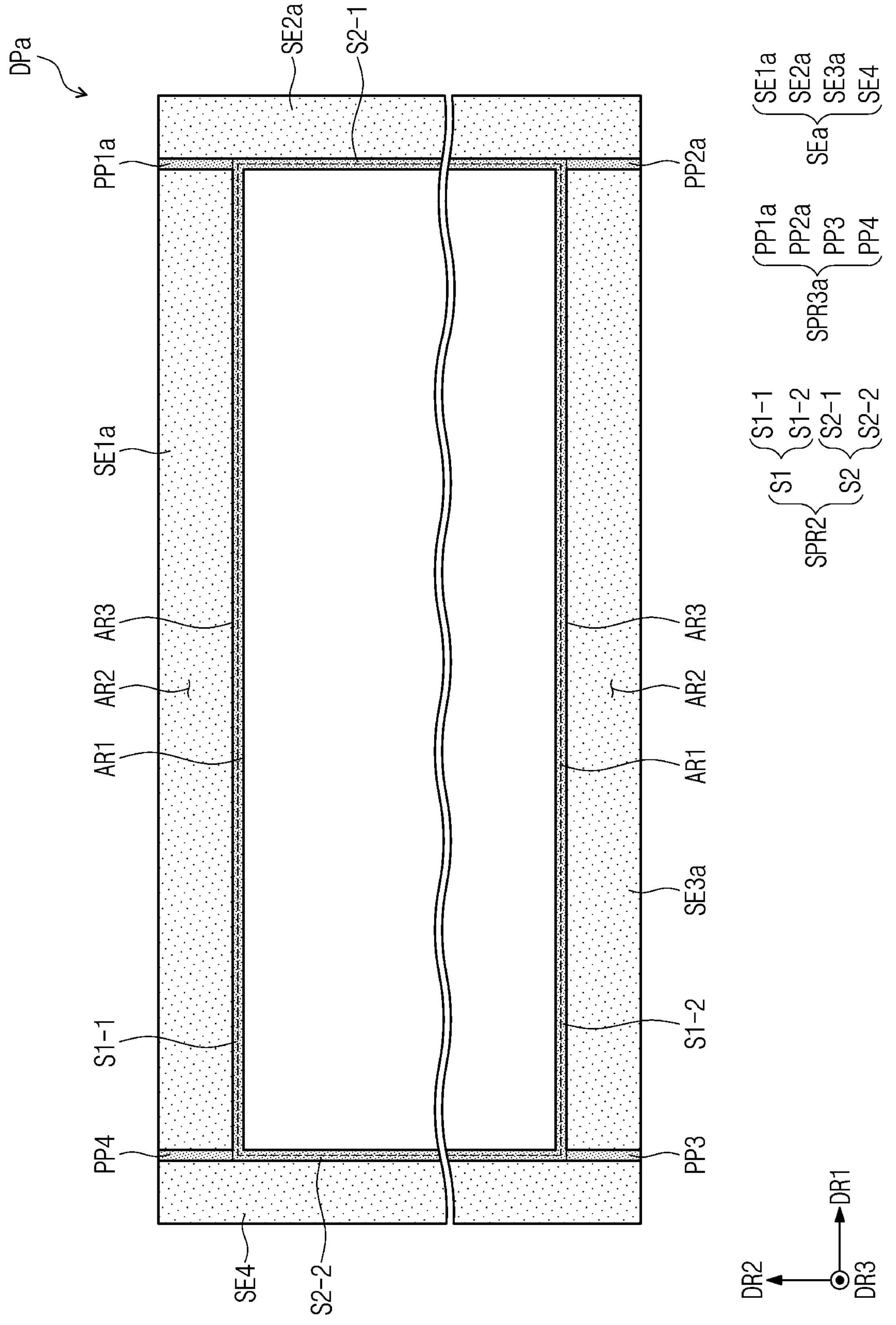
FIGS. 9, 10, 11, and 12 are schematic plan views of a display panel according to an embodiment.

FIG. 9 is a schematic plan view of a display panel Dpa according to an embodiment. FIG. 9 illustrates various shapes of a conductive pattern layer Sea which is electrically insulated by a peripheral partition portion SPR3*a*.

Referring to FIG. 8 and FIG. 9, the peripheral boundary portion SPR2 may include a first side S1 extending in the first direction DR1 and second sides S2 intersecting the first direction DR1. The first side S1 may include a (1-1)th side S1-1 and a (1-2)th side S1-2, and the second side S2 may include a (2-1)th side S2-1 and a (2-2)th side S2-2. The (1-1)th side S1-1, the (2-1)th side S2-1, the (1-2)th side S1-2, and the (2-2)th side S2-2 may be connected to each other, and may have a quadrangular shape. However, this is an example, and the shape of the peripheral boundary portion SPR2 is not limited thereto. For example, the peripheral boundary portion SPR2 may have various shapes in correspondence to the display region DA.

The peripheral partition portion SPR3*a* may include peripheral partition portions PP1*a*, PP2*a*, PP3, and PP4 disposed in the second region AR2. The peripheral partition portions PP1*a*, PP2*a*, PP3, and PP4 may include first to fourth peripheral partition portions PP1*a*, PP2*a*, PP3, and PP4. Each of the first to fourth peripheral partition portions PP1*a*, PP2*a*, PP3, and PP4 may extend from at least one of the first side S1 and the second sides S2. For example, the first and fourth peripheral partition portions PP1*a* and PP4 may extend from the (1-1)th side S1-1 in the second direction DR2, and the second and third peripheral partition portions PP2*a* and PP3 may extend from the (1-2)th side S1-2 in a direction opposite to the second direction DR2. Meanwhile, the directions indicated by the first to third directions DR1, DR2, and DR3 may be relative concepts and may be changed to other directions. FIG. 9 illustrates the peripheral partition portions PP1*a*, PP2*a*, PP3, and PP4 extending from the first side S1, but embodiments are not limited thereto. The peripheral partition portions PP1*a*, PP2*a*, PP3, and PP4 may extend from the second sides S2 in the first direction DR1 or in a direction opposite to the first direction DR1.

The first conductive pattern layer SE1*a* and the second conductive pattern layer SE2*a* may be electrically separated by the first peripheral partition portion PP1*a*, and the second conductive pattern layer SE2*a* and the third conductive pattern layer SE3*a* may be electrically separated by the second peripheral partition portion PP2*a*. The third conductive pattern layer SE3*a* and the fourth conductive pattern layer SE4 may be electrically separated by the third peripheral partition portion PP3, and the fourth conductive pattern layer SE4 and the first conductive pattern layer SE1*a* may be electrically separated by the fourth peripheral partition portion PP4. For example, the conductive pattern layer Sea may be electrically separated into conductive pattern layers SE1*a*, SE2*a*, SE3*a*, and SE4 by the peripheral partition portions PP1*a*, PP2*a*, PP3, and PP4.

The electrically separated first to fourth conductive pattern layers SE1*a*, SE2*a*, SE3*a*, and SE4 may be electrically connected to the voltage lines VL through contact-holes CNT. The voltage lines VL connected to the first to fourth conductive pattern layers SE1*a*, SE2*a*, SE3*a*, and SE4 may all be the same, or different. For example, the second power line VSL may be connected to the first conductive pattern layer SE1*a* and the third conductive pattern layer SE3*a*, and the reference voltage line VRL may be connected to the second conductive pattern layer SE2*a* and the fourth conductive pattern layer SE4. However, this is an example, and voltage lines VL respectively connected to the first to fourth conductive pattern layers SE1*a*, SE2*a*, SE3*a*, and SE4 may be four voltage lines different from each other.

Figure 10:
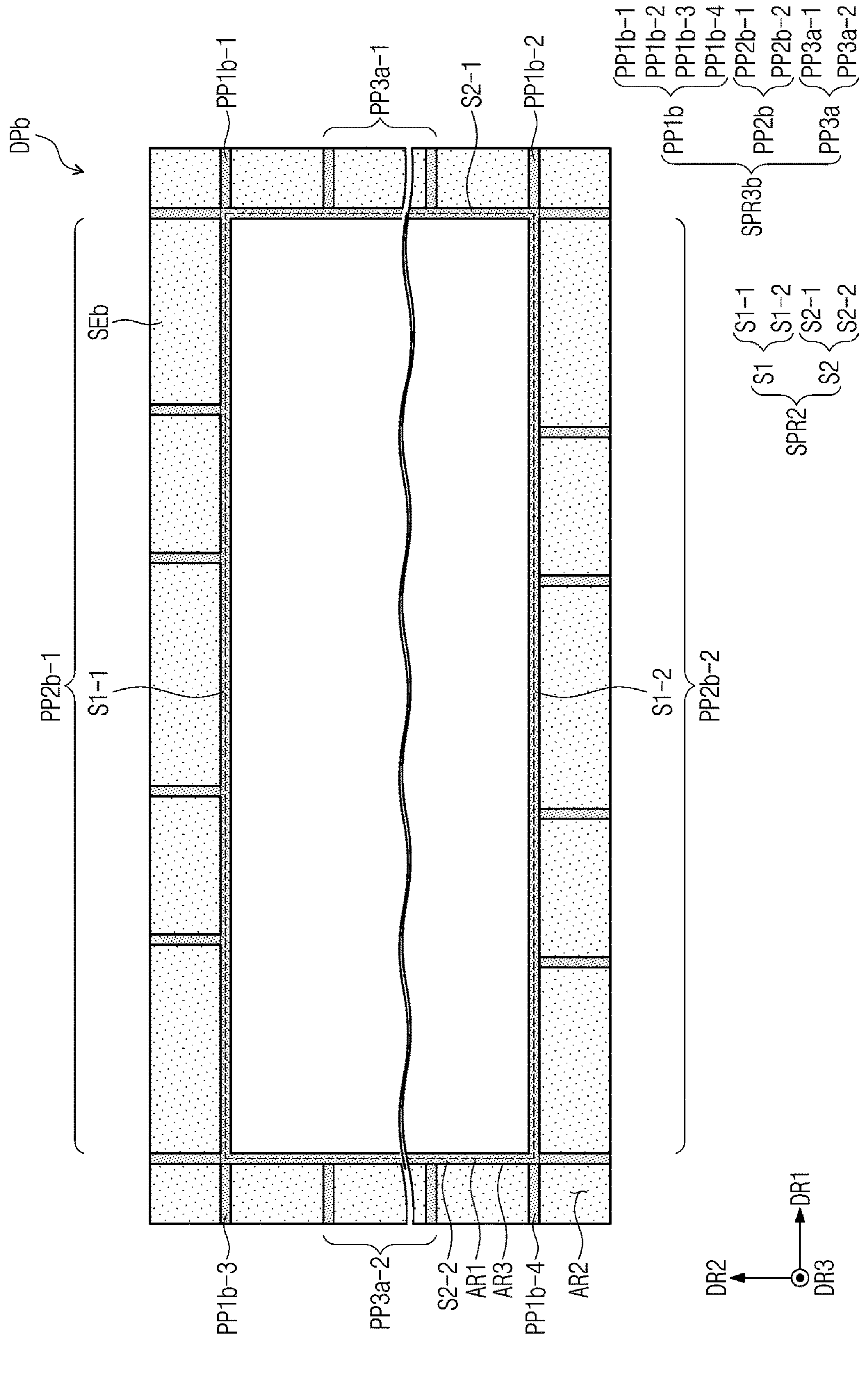

FIG. 10 is a schematic plan view of a display panel DPb according to an embodiment. FIG. 10 illustrates various shapes of a conductive pattern layer SEb which is electrically insulated by a peripheral partition portion SPR3*b*. FIG. 10 will be described with reference to FIG. 9, and descriptions of the same reference numerals will be omitted for descriptive convenience.

Referring FIG. 8 and FIG. 10, the peripheral partition portion SPR3*b* may include peripheral partition portions, PP1*b*, PP2*b*, and PP3*a* disposed in the second region AR2. The peripheral partition portions PP1*b*, PP2*b*, and PP3*a* may include first to third peripheral partition portions PP1*b*, PP2*b*, and PP3*a*.

The first peripheral partition portion PP1*b* may include a (1-1)th portion PP1*b*-1, a (1-2)th portion PP1*b*-2, a (1-3)th portion PP1*b*-3, and a (1-4)th portion PP1*b*-4, The first peripheral partition portion PP1*b* may extend from the first side S1 in a direction parallel to the first direction DR1. For example, the (1-1)th portion PP1*b*-1 may extend from the (1-1)th side S1-1 in the first direction DR1, and the (1-2)th portion PP1*b*-2 may extend from the (1-2)th side S1-2 in the first direction DR1. The (1-3)th portion PP1*b*-3 may extend from the (1-1)th side S1-1 in a direction opposite to the first direction DR1, and the (1-4)th portion PP1*b*-4 may extend from the (1-2)th side S1-2 in a direction opposite to the first direction DR1.

The second peripheral partition portion PP2*b* may include (2-1)th portions PP2*b*-1 and (2-2)th portions PP2*b*-2. The second peripheral partition portion PP2*b* may extend from the first side S1 in a direction parallel to the second direction DR2. For example, the (2-1)th portions PP2*b*-1 may extend from the (1-1)th side S1-1 in the second direction DR2, and the (2-2)th portion PP2*b*-2 may extend from the (1-2)th side S1-2 in a direction opposite to the second direction DR2.

The third peripheral partition portion PP3*a* may include (3-1)th portions PP3*a*-1 and (3-2)th portions PP3*a*-2. The third peripheral partition portion PP3*a* may protrude and extend from the second side S2 in a direction parallel to the first direction DR1. For example, the (3-1)th portions PP3*a*-1 may protrude and extend from the (2-1)th side S2-1 in the first direction DR1, and the (3-2)th portions PP3*a*-2 may protrude and extend from the (2-2)th side S2-2 in a direction opposite to the first direction DR1.

The conductive pattern layer SEb may be electrically separated for the first to third peripheral partition portions PP1*b*, PP2*b*, and PP3*a*. For example, the conductive pattern layer SEb adjacent to a peripheral partition portion may be electrically separated by a peripheral partition portion. In FIG. 10, the conductive pattern layer SEb may be electrically separated into twenty conductive pattern layers SEb by twenty peripheral partition portions PP1*b*, PP2*b*, and PP3*a*.

The electrically separated conductive pattern layers SEb may be electrically connected to the voltage lines VL through contact-holes CNT. The voltage lines VL connected to the conductive pattern layers SEb may all be the same, or different.

FIG. 10 illustrates four first partition portions PP1*b*, twelve second partition portions PP2*b*, and four third partition portions PP3*a*, but the number of peripheral partition portions PP1*b*, PP2*b*, and PP3*a* is not limited thereto. The number of the peripheral partition portions PP1*b*, PP2*b*, and PP3*a* may vary according to the number of the voltage lines VL to electrically separate the conductive pattern layer SEb and connect the electrically separated conductive pattern layer SEb to different voltage lines VL, respectively.

For example, intervals (or distances) of the peripheral partition portions PP1*b*, PP2*b*, and PP3*a* in FIG. 10 are examples, and embodiments are not limited thereto. The intervals (or distances) of the peripheral partition portions PP1*b*, PP2*b*, and PP3*a* may vary according to the sizes (e.g., lengths) of conductive pattern layers SEb to be connected to the different voltage lines VL, respectively.

Figure 11:
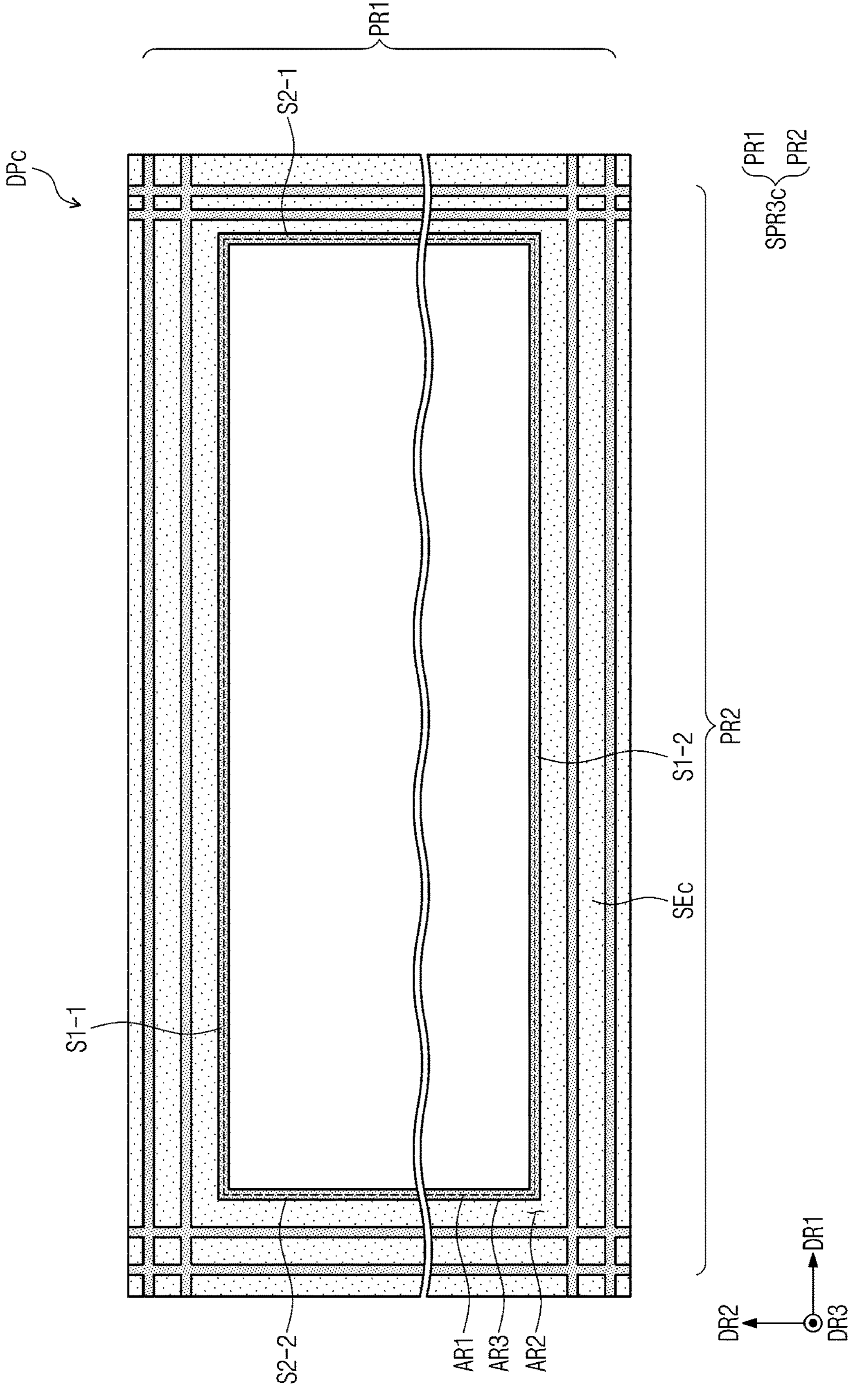

FIG. 11 is a schematic plan view of a display panel DPc according to an embodiment. FIG. 11 illustrates various shapes of a conductive pattern layer SEc which is electrically insulated by a peripheral partition portion SPR3*c*. FIG.

11 will be described with reference to FIG. 9, and descriptions of the same reference numerals will be omitted for descriptive convenience.

Referring to FIG. 8 and FIG. 11, the peripheral partition portion SPR3*c* may include first sub-peripheral partition portions PR1 and second sub-peripheral partition portions PR2. The first sub-peripheral partition portions PR1 may extend in the first direction DR1, and may be disposed spaced apart in the second direction DR2. The second sub-peripheral partition portions PR2 may extend in the second direction DR2, and may be disposed spaced apart in the first direction DR1. The first sub-peripheral partition portions PR1 may cross the second sub-peripheral partition portions PR2. Therefore, the first sub-peripheral partition portions PR1 and the second sub-peripheral partition portions PR2 may have a lattice form.

The conductive pattern layer SEc may be electrically separated by the first sub-peripheral partition portions PR1 and the second sub-peripheral partition portions PR2. For example, a conductive pattern layer adjacent to a sub-peripheral partition portion may be electrically separated by one sub-peripheral partition portion. In FIG. 11, the conductive pattern layer SEc may be electrically separated into twenty five conductive pattern layers SEc by four first sub-peripheral partition portions PR1 and four second sub-peripheral partition portions PR2.

The electrically separated conductive pattern layers SEc may be electrically connected to the voltage lines VL through contact-holes CNT. The voltage lines VL connected to the conductive pattern layers SEc may all be the same, or different.

FIG. 11 illustrates the four first sub-peripheral partition portions PR1 and the four second sub-peripheral partition portions PR2, but the number of the first and second sub-peripheral partition portions PR1 and PR2 is not limited thereto. The number of the first and second sub-peripheral partition portions PR1 and PR2 may vary according to the number of the voltage lines VL to electrically separate the conductive pattern layer SEc and connect the electrically separated conductive pattern layer SEc to different voltage lines VL, respectively.

For example, intervals (or distances) of the first sub-peripheral partition portions PR1 and the second sub-peripheral partition portions PR2 in FIG. 11 are examples, and embodiments are not limited thereto. The intervals (or distances) of the first sub-peripheral partition portions PR1 and the second sub-peripheral partition portions PR2 may vary according to the sizes (e.g., lengths) of conductive pattern layers SEc to be connected to the different voltage lines VL, respectively.

Figure 12:
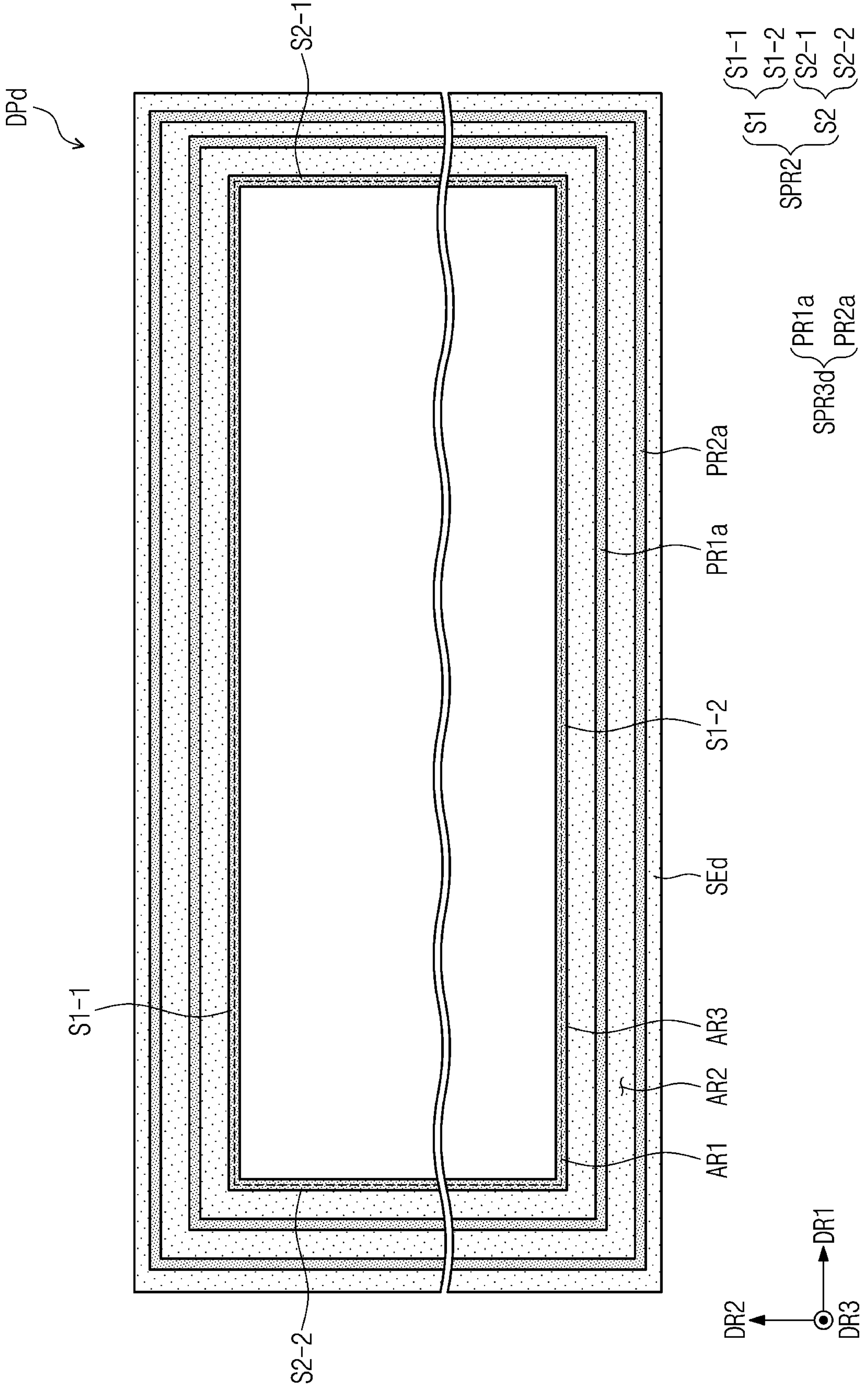

FIG. 12 is a schematic plan view of a display panel DPd according to an embodiment. FIG. 12 illustrates various shapes of a conductive pattern layer SEd which is electrically insulated by a peripheral partition portion SPR3*d*. FIG. 12 will be described with reference to FIG. 9, and descriptions of the same reference numerals will be omitted for descriptive convenience.

Referring to FIG. 8 and FIG. 12, the peripheral partition portion SPR3*d* may be disposed in the second region AR2 and include a first sub-peripheral partition portion PR1*a* surrounding the peripheral boundary portion SPR2. For example, the first sub-peripheral partition portion PR1*a* may surround the first side S1 and the second side S2 of the peripheral boundary portion SPR2. The peripheral partition portion SPR3*d* may further include a second sub-peripheral partition portion PR2*a* surrounding the first sub-peripheral partition portion PR1*a*. For example, the first sub-peripheral partition portion PR1*a* and the second sub-peripheral partition portion PR2*a* may have a closed curve shape.

The conductive pattern layer SEd may be electrically separated by the first sub-peripheral partition portion PR1*a* and the second sub-peripheral partition portion PR2*a*. For example, a conductive pattern layer adjacent to a sub-peripheral partition portion may be electrically separated by one sub-peripheral partition portion. In FIG. 12, the conductive pattern layer SEd may be electrically separated into three conductive pattern layers SEd by one first sub-peripheral partition portion PR1*a* and one second sub-peripheral partition portion PR2*a*.

The electrically separated conductive pattern layers SEd may be electrically connected to the voltage lines VL through contact-holes CNT. The voltage lines VL connected to the conductive pattern layers SEd may all be the same, or different.

FIG. 12 illustrates one first sub-peripheral partition portion PR1*a* and one second sub-peripheral partition portion PR2*a*, but the number of the first and second sub-peripheral partition portions PR1*a* and PR2*a* is not limited thereto. The number of the first and second sub-peripheral partition portions PR1*a* and PR2*a* may vary according to the number of the voltage lines VL to electrically separate the conductive pattern layer SEd and connect the electrically separated conductive pattern layer SEd to different voltage lines VL, respectively.

For example, intervals (or distances) of the first sub-peripheral partition portion PR1*a* and the second sub-peripheral partition portion PR2*a* in FIG. 12 are examples, and embodiments are not limited thereto. The intervals (or distances) of the first sub-peripheral partition portion PR1*a* and the second sub-peripheral partition portion PR2*a* may vary according to the sizes (e.g., lengths) of conductive pattern layer SEd to be connected to the different voltage lines VL, respectively.

Figure 13:
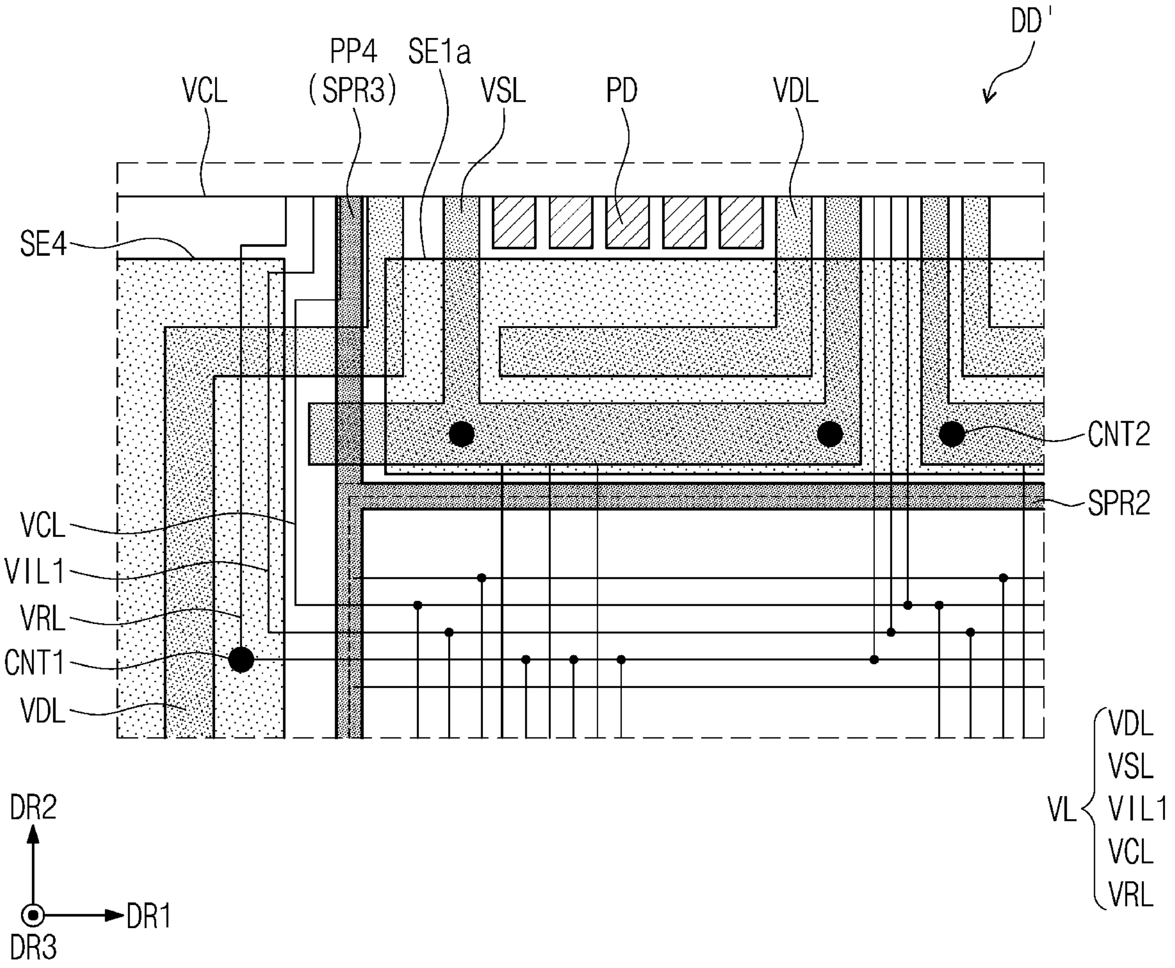
FIGS. 13, 14, and 15 are schematic views of an enlarged region corresponding to region DD' of FIG. 8.

FIG. 13 is a schematic view of an enlarged region corresponding to region DD' of FIG. 8. FIG. 13 will be described with reference to FIG. 8 and the FIG. 9, and descriptions of the same reference numerals will be omitted for descriptive convenience.

Referring to FIG. 9 and FIG. 13, the fourth peripheral partition portion PP4 of the peripheral partition portion SPR3 may electrically separate the first conductive pattern layer SE1*a* and the fourth conductive pattern layer SE4. Different voltage lines VL may be respectively connected to the first conductive pattern layer SE1*a* and the fourth conductive pattern layer SE4 electrically separated. For example, the fourth conductive pattern layer SE4 may be connected to the reference voltage line VRL through the first contact-hole CNT1, and the first conductive pattern layer SE1*a* may be connected to the second power line VSL through the second contact-hole CNT2. For example, the third power supply voltage VREF (see FIG. 2A) may be provided to the fourth conductive pattern layer SE4, and the second power supply voltage VSS (see FIG. 2A) may be provided to the first conductive pattern layer SE1*a*.

FIG. 13 illustrates that the first conductive pattern layer SE1*a* and the fourth conductive pattern layer SE4 are respectively connected to the second power line VSL and the reference voltage line VRL, but the voltage lines VL to which the conductive pattern layers SE1*a* and SE4 are connected are not limited thereto. The first conductive pattern layer SE1*a* may be connected to one of the first power line VDL, the second power line VSL, the first initialization voltage line VIL1, the compensation voltage line VCL, and the reference voltage line VRL. For example, the fourth conductive pattern layer SE4 may be connected to one of the voltage lines VL other than the voltage line to which the first conductive pattern layer SE1*a* is connected.

Figure 14:
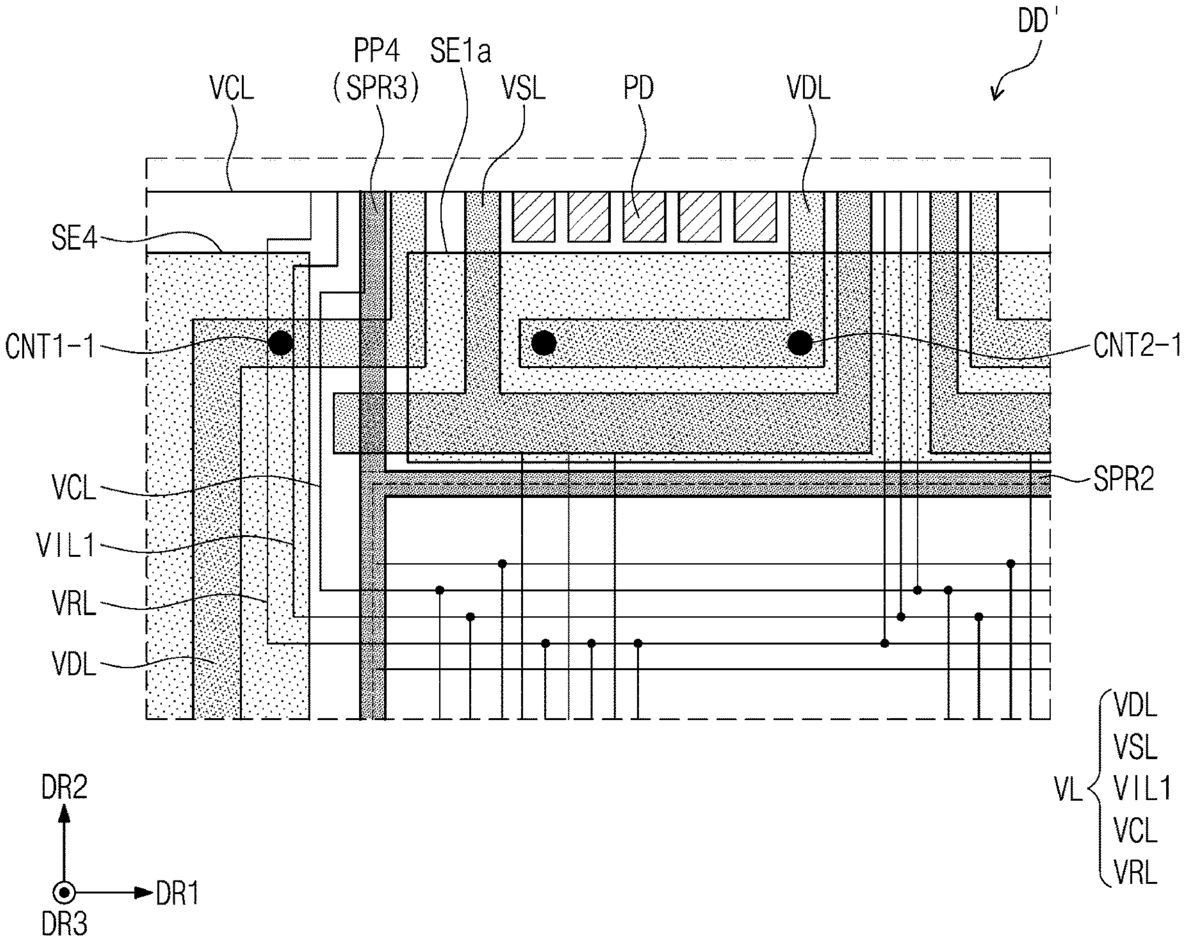

FIG. 14 is a schematic view of an enlarged region corresponding to region DD' of FIG. 8. FIG. 14 will be described with reference to FIG. 8 and the FIG. 9, and descriptions of the same reference numerals will be omitted for descriptive convenience.

Referring to FIG. 9 and FIG. 14, the fourth peripheral partition portion PP4 of the peripheral partition portion SPR3 may electrically separate the first conductive pattern layer SE1*a* and the fourth conductive pattern layer SE4. However, the first conductive pattern layer SE1*a* and the fourth conductive pattern layer SE4, which are electrically separated from each other, may be connected to the same voltage line among the voltage lines VL. For example, the first conductive pattern layer SE1*a* may be connected to the first power line VDL through a second contact-hole CNT2-1, and the fourth conductive pattern layer SE4 may be connected to the first power line VDL through a first contact-hole CNT1-1. For example, the first power supply voltage VDD (see FIG. 2A) may be provided to the first conductive pattern layer SE1*a*, and the first power supply voltage VDD may also be provided to the fourth conductive pattern layer SE4.

FIG. 14 illustrates that the first conductive pattern layer SE1*a* and the fourth conductive pattern layer SE4 are connected to the first power line VDL, but embodiments are not limited thereto. The first conductive pattern layer SE1*a* and the fourth conductive pattern layer SE4 may be connected to the same one voltage line among the second power line VSL, the first initialization voltage line VIL1, the compensation voltage line VCL, and the reference voltage line VRL.

Figure 15:
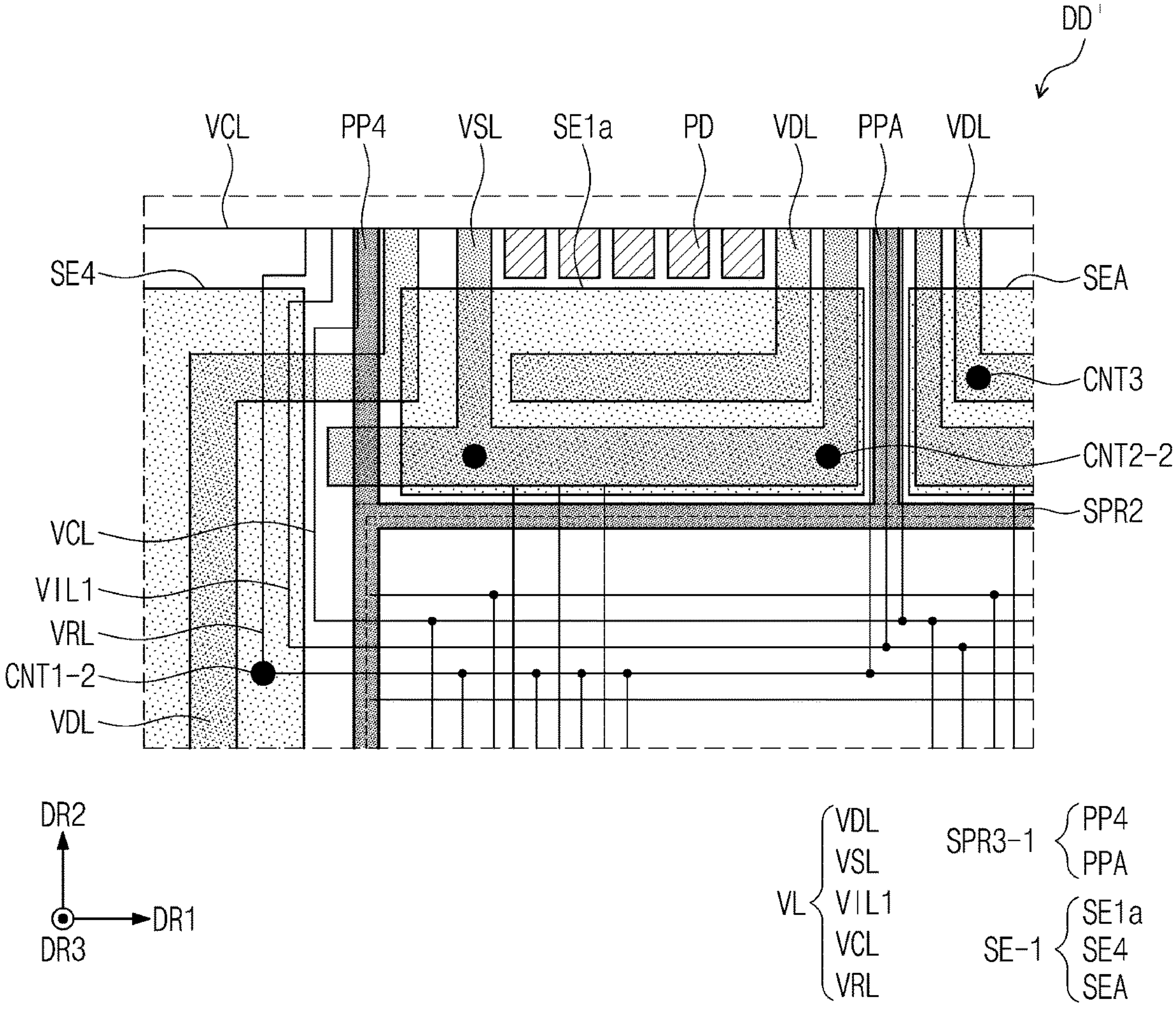

FIG. 15 is a schematic view of an enlarged region corresponding to region DD' of FIG. 8.

Referring to FIG. 8 and FIG. 15, a peripheral partition portion SPR3-1 of FIG. 15 may further include an additional partition portion PPA. For example, a fourth peripheral partition portion PP4 and the additional partition portion PPA of the peripheral partition portion SPR3-1 may electrically separate a conductive pattern layer SE−1. Since the peripheral partition portion SPR3-1 further includes the additional partition portion PPA, the conductive pattern layer SE−1 may be separated to further include an additional conductive pattern layer SEA. For example, the fourth peripheral partition portion PP4 may electrically separate the first conductive pattern layer SE1*a* and the fourth conductive pattern layer SE4, and the additional partition portion PPA may electrically separate the first conductive pattern layer SE1*a* and the additional conductive pattern layer SEA.

Different voltage lines VL may be respectively connected to the first conductive pattern layer SE1*a*, the fourth conductive pattern layer SE4, and the additional conductive pattern layer SEA electrically separated. For example, the fourth conductive pattern layer SE4 may be connected to the reference voltage line VRL through a first contact-hole CNT1-2, and the first conductive pattern layer SE1*a* may be connected to the second power line VSL through a second contact-hole CNT2-2. The additional conductive pattern layer SEA may be connected to the first power line VDL through a third contact-hole CNT3. For example, the third power supply voltage VREF (see FIG. 2A) may be provided to the fourth conductive pattern layer SE4, the second power supply voltage VSS (see FIG. 2A) may be provided to the first conductive pattern layer SE1*a*, and the first power supply voltage VDD (see FIG. 2A) may be provided to the additional conductive pattern layer SEA.

FIG. 15 illustrates that the first conductive pattern layer SE1*a* is connected to the second power line VSL, the fourth conductive pattern layer SE4 is connected to the reference voltage line VRL, and the additional conductive pattern layer SEA is connected to the first power line VDL, but the voltage lines VL to which conductive pattern layers SE−1 are connected are not limited thereto. The first conductive pattern layer SE1*a*, the fourth conductive pattern layer SE4, and the additional conductive pattern layer SEA may be commonly connected to one of the voltage lines VL, may be connected to two different ones of the voltage lines VL, and may be connected to three different voltage lines VL.

According to an embodiment, since the voltage lines VL are connected to the plurality conductive pattern layers SE, the resistance of a circuit may be lowered. For example, by utilizing the conductive pattern layer SE or SE−1 disposed in the peripheral region NDA (see FIG. 3A) that have not been typically utilized, unpredictable operations of neglected conductive pattern layer SE or SE−1 may be reduced or eliminated, and the degree of freedom in design of a circuit may be improved.

Figure 16:
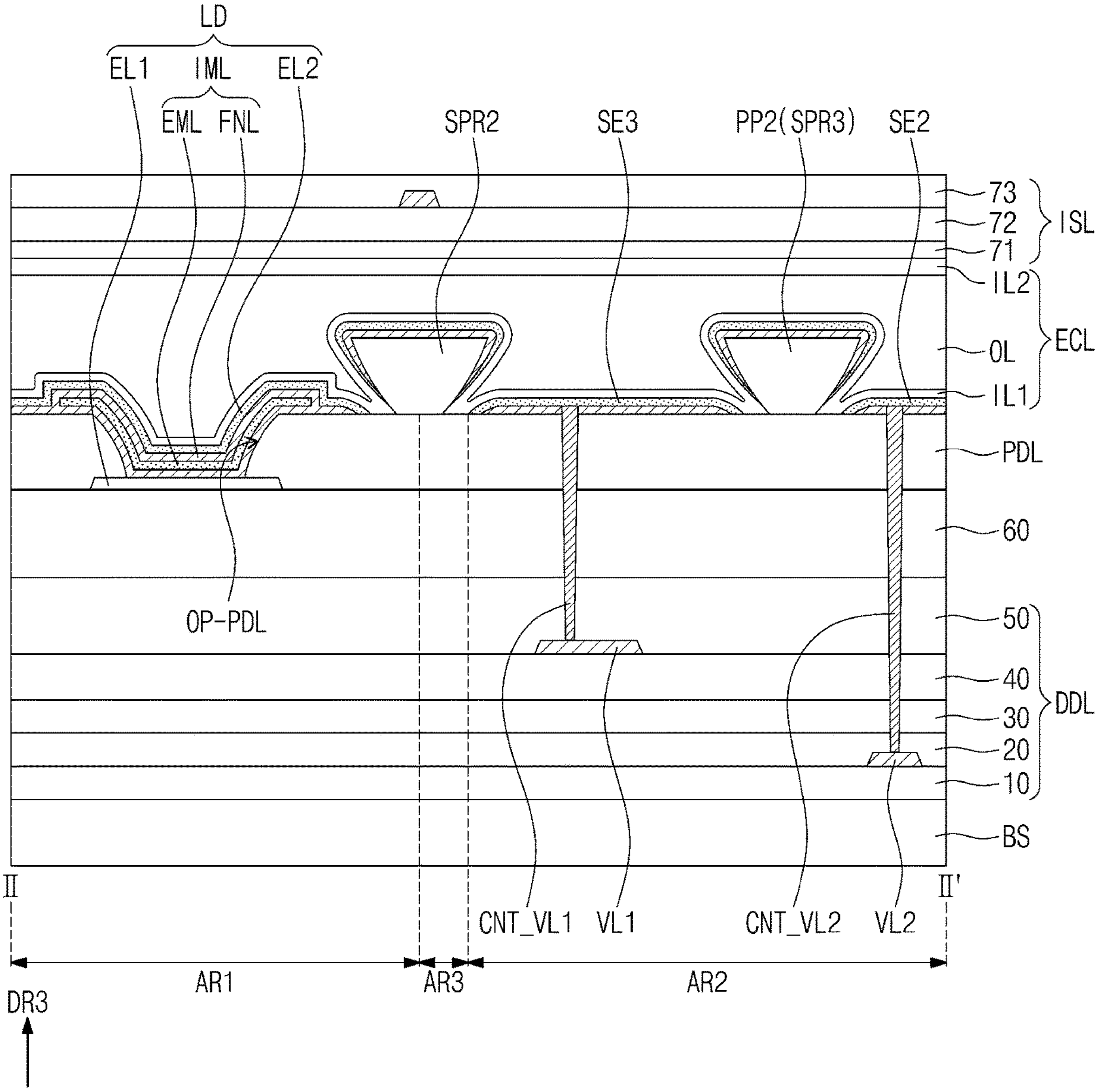
FIG. 16 is a schematic cross-sectional view taken along line II-IF of FIG. 7.

FIG. 16 is a schematic cross-sectional view taken along line II-IF of FIG. 7. FIG. 16 will be described with reference to FIG. 5, and descriptions of the same reference numerals will be omitted for descriptive convenience.

Referring to FIG. 7 and FIG. 16, in the second region AR2, a first voltage line VL1 and a second voltage line VL2 may be disposed on one of the base layer BS and the first to sixth insulation layers 10, 20, 30, 40, 50, and 60. Each of the first voltage line VL1 and the second voltage line VL2 may be one of the first power line VDL, the second power line VSL, the reference voltage line VRL, the first initialization voltage line VIL1, the second initialization voltage line VIL2, and the compensation voltage line VCL of FIG. 2A.

Each of the conductive pattern layers SE2 and SE3 may be electrically connected to one of the first power line VDL, the second power line VSL, the reference voltage line VRL, the first initialization voltage line VIL1, the second initialization voltage line VIL2, and the compensation voltage line VCL. For example, the third conductive pattern layer SE3 may be electrically connected to the first voltage line VL1 disposed on the fourth insulation layer 40 through a contact-hole CNT_VL1, and the second conductive pattern layer SE2 may be electrically connected to the second voltage line VL2 disposed on the first insulation layer 10 through a contact-hole CNT_VL2. The first voltage line VL1 and the second voltage line VL2 may be the same voltage line, or different voltage lines. FIG. 16 illustrates that the first voltage line VL1 and the second voltage line VL2 are respectively disposed on the fourth insulation layer 40 and the first insulation layer 10, but embodiments are not limited thereto.

According to the above description, in case that a driving transistor is an N-type transistor, a display panel may connect a cathode of a light emitting device to the driving transistor, thereby preventing a change in a gate-source voltage of the driving transistor. Accordingly, since a change amount of a driving current due to the deterioration of the light emitting device may be reduced, afterimage defects of the display panel due to an increase in usage time may be reduced and the lifespan thereof may be improved. For example, the display panel may further include a connection wiring for connecting the light emitting device and a pixel circuit, so that it is possible to achieve stable connection to the pixel circuit by changing only the shape of a cathode without changing the design of emitting parts. Accordingly, the influence of arrangement or shape of the emitting parts on the connection with the pixel circuit may be reduced, so that the degree of freedom in design of the pixel circuit may be improved and the degradation in the aperture ratio of an emitting part may be prevented.

According to the above description, voltage lines may be connected to conductive pattern layers, so that the resistance of a circuit may be lowered. For example, by utilizing conductive pattern layers of a peripheral region that have not been typically utilized, unpredictable operations of neglected conductive pattern layers may be reduced or eliminated, and the degree of freedom in design of a circuit may be improved.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:

a display panel including a display region and a peripheral region surrounding the display region, the display panel including:

a first region overlapping the display region, a second region overlapping a portion of the peripheral region, and a third region overlapping another portion of the peripheral region and disposed between the first region and the second region, wherein the display panel includes:

a plurality of light emitting devices disposed in the first region, each of the plurality of light emitting devices including:

a first electrode, an intermediate layer disposed on the first electrode, and a second electrode disposed on the intermediate layer;

a separator including:

a pixel boundary portion disposed in the first region, a peripheral partition portion disposed in the second region, and a peripheral boundary portion disposed in the first region and the third region; and a plurality of conductive pattern layers disposed in the second region, a plurality of second electrodes of the plurality of light emitting devices are electrically separated by the pixel boundary portion, and the plurality of conductive pattern layers are electrically separated by the peripheral partition portion.

2. The display device of claim 1, wherein the display panel further comprises a pixel definition film defining a light emitting opening which exposes at least a portion of the first electrode, and the pixel boundary portion, the peripheral boundary portion, and the peripheral partition portion are disposed on the pixel definition film.

3. The display device of claim 2, wherein

The plurality of second electrodes and the plurality of conductive pattern layers comprise a same material, and the plurality of second electrodes and the plurality of conductive pattern layers are disposed on the pixel definition film.

4. The display device of claim 1, wherein the display panel further comprises a base layer, and a plurality of insulation layers disposed on the base layer, and a plurality of voltage lines for transmitting different voltages are disposed on at least one of the base layer and the plurality of insulation layers in the second region.

5. The display device of claim 4, wherein each of the plurality of conductive pattern layers is electrically connected to at least one of the plurality of voltage lines.

6. The display device of claim 1, wherein the peripheral partition portion comprises a plurality of peripheral partition portions protruding and extending from the peripheral boundary portion.

7. The display device of claim 6, wherein the peripheral boundary portion comprises:

a first side extending in a first direction, and a second side intersecting the first direction, and each of the plurality of peripheral partition portions extends from at least one of the first side and the second side of the peripheral boundary portion.

8. The display device of claim 7, wherein each of the plurality of peripheral partition portions extends from the first side of the peripheral boundary portion in a direction parallel to the first direction.

9. The display device of claim 7, wherein some of the plurality of peripheral partition portions protrude and extend from the first side of the peripheral boundary portion in a direction parallel to a second direction intersecting the first direction, and others of the plurality of peripheral partition portions protrude and extend from the second side of the peripheral boundary portion in a direction parallel to the first direction.

10. The display device of claim 1, wherein the peripheral partition portion comprises:

a plurality of first sub-peripheral partition portions extending in a first direction, and disposed spaced apart in a second direction intersecting the first direction; and a plurality of second sub-peripheral partition portions extending in the second direction, and disposed spaced apart in the first direction.

11. The display device of claim 10, wherein the plurality of first sub-peripheral partition portions intersect the plurality of second sub-peripheral partition portions.

12. The display device of claim 1, wherein the peripheral partition portion comprises a first sub-peripheral partition portion surrounding the peripheral boundary portion.

13. The display device of claim 12, wherein the peripheral partition portion further comprises a second sub-peripheral partition portion surrounding the first sub-peripheral partition portion.

14. The display device of claim 1, wherein the separator includes a multi-layered member including at least one of an organic material, a metal, or a transparent electrode.

15. The display device of claim 1, wherein the display panel further comprises:

a plurality of transistors; and a plurality of connection wirings that connect the plurality of light emitting devices and the plurality of transistors, respectively, and each of the plurality of connection wirings includes:

a first connection part connected to a corresponding light emitting device among the plurality of light emitting devices, and spaced apart from a light emitting opening in which the corresponding light emitting device is defined in a plan view; and a second connection part connected to a corresponding transistor among the plurality of transistors.

16. The display device of claim 15, wherein each of the plurality of connection wirings comprises a first layer, a second layer, and a third layer, a side surface of the third layer forms a tip part protruding from a side surface of the second layer, and the second electrode is disconnected by the tip part.

17. The display device of claim 15, wherein each of the plurality of transistors is an N-type oxide semiconductor.

18. A display panel comprising:

a base layer including a display region and a peripheral region surrounding the display region, the base layer including:

a first region overlapping the display region, a second region overlapping a portion of the peripheral region, and a third region overlapping another portion of the peripheral region and disposed between the first region and the second region;

a first light emitting device disposed on the first region of the base layer, the first light emitting device including:

a first anode electrode, a first intermediate layer disposed on the first anode electrode, and a first cathode electrode disposed on the first intermediate layer;

a second light emitting device disposed on the first region of the base layer, the second light emitting device including:

a second anode electrode, a second intermediate layer disposed on the second anode electrode, and a second cathode electrode disposed on the second intermediate layer;

a plurality of conductive pattern layers disposed in the second region;

a pixel boundary portion disposed in the first region, and separating the first cathode electrode and the second cathode electrode;

a peripheral partition portion disposed in the second region, and separating the plurality of conductive pattern layers; and a peripheral boundary portion disposed in the first region and in the third region.

19. The display panel of claim 18, wherein the first cathode electrode, the second cathode electrode, and the plurality of conductive pattern layers comprise a same material.

20. The display panel of claim 18, further comprising:

a plurality of insulation layers disposed on the base layer, wherein a plurality of voltage lines for transmitting different voltages are disposed on at least one of the base layer and the plurality of insulation layers in the second region.

21. The display panel of claim 20, wherein each of the plurality of conductive pattern layers is electrically connected to at least one of the plurality of voltage lines.

22. The display panel of claim 18, wherein the peripheral partition portion comprises a plurality of peripheral partition portions protruding and extending from the peripheral boundary portion.

23. The display panel of claim 22, wherein the peripheral boundary portion comprises:

a first side extending in a first direction, and a second side intersecting the first direction, and each of the plurality of peripheral partition portions extends from at least one of the first side and the second side of the peripheral boundary portion.

24. The display panel of claim 23, wherein each of the plurality of peripheral partition portions extends from the first side of the peripheral boundary portion in the first direction.

25. The display panel of claim 23, wherein some of the plurality of peripheral partition portions protrude and extend from the first side of the peripheral boundary portion in a direction parallel to a second direction intersecting the first direction, and others of the plurality of peripheral partition portions protrude and extend from the second side of the peripheral boundary portion in a direction parallel to the first direction.

26. The display panel of claim 18, wherein the peripheral partition portion comprises:

a plurality of first sub-peripheral partition portions extending in a first direction, and disposed spaced apart in a second direction intersecting the first direction; and a plurality of second sub-peripheral partition portions extending in the second direction, and disposed spaced apart in the first direction, and the plurality of first sub-peripheral partition portions intersect the plurality of second sub-peripheral partition portions.

27. The display panel of claim 18, wherein the peripheral partition portion comprises:

first sub-peripheral partition portions surrounding the peripheral boundary portion, and second sub-peripheral partition portions surrounding the first sub-peripheral partition portions.

28. An electronic device comprising:

a display region and a peripheral region surrounding the display region, the electronic device including:

a first region overlapping the display region, a second region overlapping a portion of the peripheral region, and a third region overlapping another portion of the peripheral region and disposed between the first region and the second region;

a plurality of light emitting devices disposed in the first region, each of the plurality of light emitting devices including a plurality of cathode electrodes;

a plurality of conductive pattern layers disposed in the second region;

a pixel boundary portion disposed in the first region, and electrically separating the plurality of cathode electrodes;

a peripheral partition portion disposed in the second region, and separating the plurality of conductive pattern layers; and a plurality of voltage lines that provide a voltage to the plurality of light emitting devices, wherein each of the plurality of conductive pattern layers is electrically connected to a corresponding one of the plurality of voltage lines.

* * * * *